(12) United States Patent
Kasano et al.

(10) Patent No.: US 7,701,024 B2
(45) Date of Patent: Apr. 20, 2010

(54) SOLID-STATE IMAGING DEVICE, MANUFACTORING METHOD THEREOF AND CAMERA

(75) Inventors: Masahiro Kasano, Osaka (JP); Takanori Yogo, Kyoto (JP); Kazutoshi Onozawa, Osaka (JP)

(73) Assignee: Panasonic Corporation, Osaka (JP)

( * ) Notice: Subject to any disclaimer, the term of this patent is extended or adjusted under 35 U.S.C. 154(b) by 127 days.

(21) Appl. No.: 11/954,948

(22) Filed: Dec. 12, 2007

(65) Prior Publication Data

US 2008/0251873 A1  Oct. 16, 2008

(30) Foreign Application Priority Data

Dec. 13, 2006  (JP)  ............................ 2006-336255
Jan. 18, 2007  (JP)  ............................ 2007-009428

(51) Int. Cl.
H01L 31/0232 (2006.01)
H01L 31/0203 (2006.01)

(52) U.S. Cl. .................. 257/432; 257/428; 257/70; 257/E31.127; 257/440

(58) Field of Classification Search ................ 257/428, 257/432, E31.123, E31.127; 438/70
See application file for complete search history.

(56) References Cited

U.S. PATENT DOCUMENTS

| 5,534,443 | A |   | 7/1996  | Ohtagaki et al. |             |
|-----------|---|---|---------|-----------------|-------------|
| 5,766,980 | A |   | 6/1998  | Ohtagaki et al. |             |
| 5,838,106 | A | * | 11/1998 | Funada          | 313/587     |
| 2006/0164720 | A1 | * | 7/2006 | Yoshida et al. | 359/359 |
| 2006/0205107 | A1 |   | 9/2006 | Inaba et al.    |             |
| 2006/0208158 | A1 |   | 9/2006 | Masashi         |             |
| 2007/0070347 | A1 | * | 3/2007 | Scherer et al.  | 356/326 |

(Continued)

FOREIGN PATENT DOCUMENTS

EP  0678922  10/1995

(Continued)

OTHER PUBLICATIONS

English language Abstract of JP 7-311310.

(Continued)

Primary Examiner—Fernando L Toledo
Assistant Examiner—Mamadou Diallo
(74) Attorney, Agent, or Firm—Greenblum & Bernstein, P.L.C.

(57) ABSTRACT

A solid-state imaging device which includes a color filter having excellent color reproduction, a manufacturing method thereof and a camera are provided.

A color filter in a solid-state imaging device 1 having an optical film thickness of approximately ¼ of a set wavelength $\lambda$, being sandwiched by a third layer and a fourth layer which are spacer layers in which only 3 layers are laminated and which consist of two types of layers (first layers and a second layer) with different refractive indexes, and further, having a structure that is sandwiched by a film, a first layer, which has a film thickness approximately equal to the above $\lambda/4$. Between the two types of layers having different refractive indexes, the first layers are composed of high refractive index material, and the second layer is composed of low refractive index material. The third layer and the fourth layer have an optical film thickness according to the light which passes through, and the material film thickness of the entire color filter also differs for each color of light.

18 Claims, 22 Drawing Sheets

U.S. PATENT DOCUMENTS

| | | |
|---|---|---|
| 2007/0170470 A1 | 7/2007 | Kuriyama |
| 2007/0235756 A1 | 10/2007 | Kato |
| 2007/0258004 A1 | 11/2007 | Honda et al. |
| 2008/0018770 A1 | 1/2008 | Kato |

FOREIGN PATENT DOCUMENTS

| | | |
|---|---|---|
| EP | 1592067 | 11/2005 |
| JP | 7-311310 | 11/1995 |
| JP | 2000-180621 | 6/2000 |
| JP | 2000-252451 | 9/2000 |
| WO | 2005/069376 | 7/2005 |

OTHER PUBLICATIONS

English language Abstract of JP 2000-180621.
English language Abstract of JP 2000-252451.

* cited by examiner

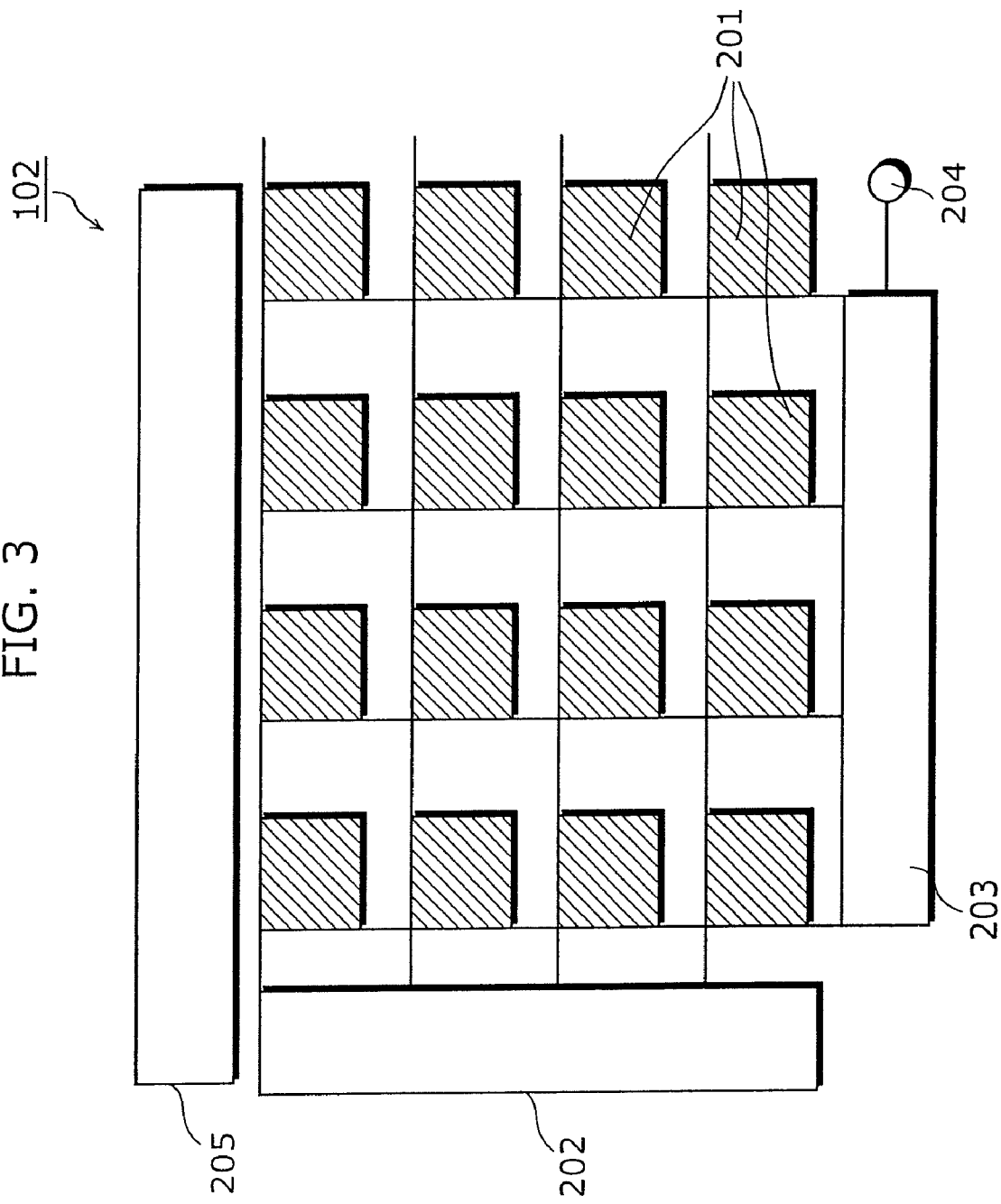

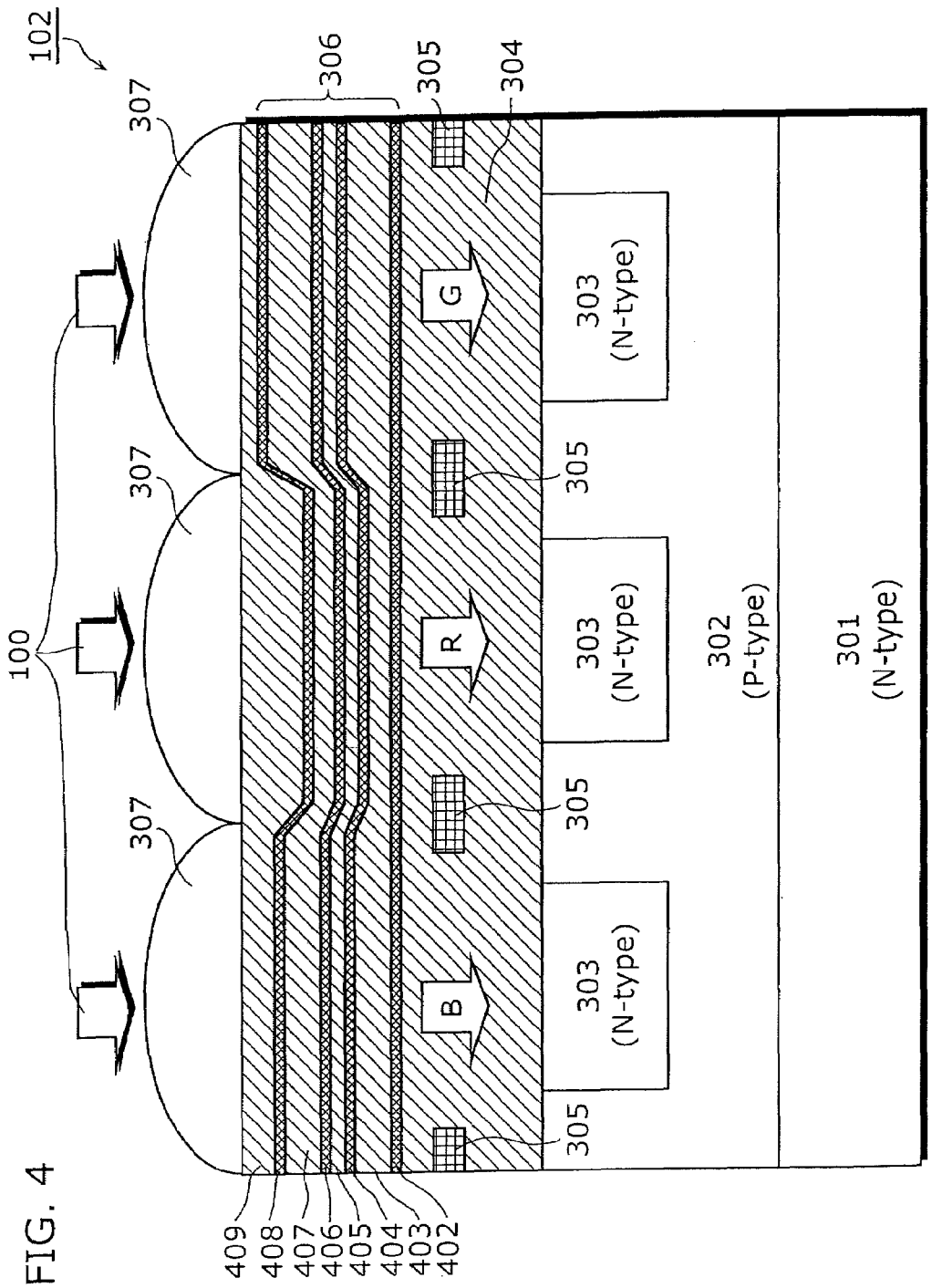

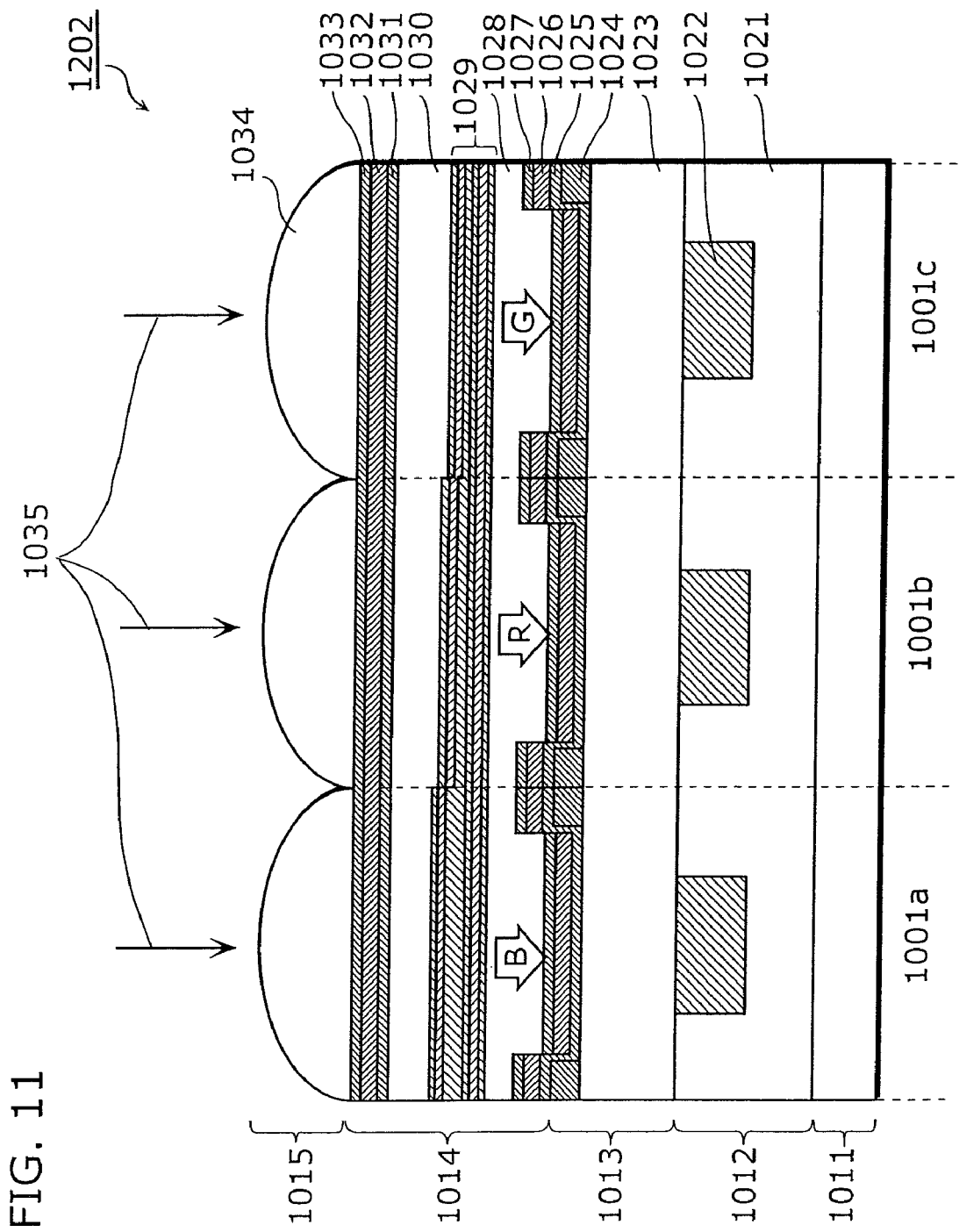

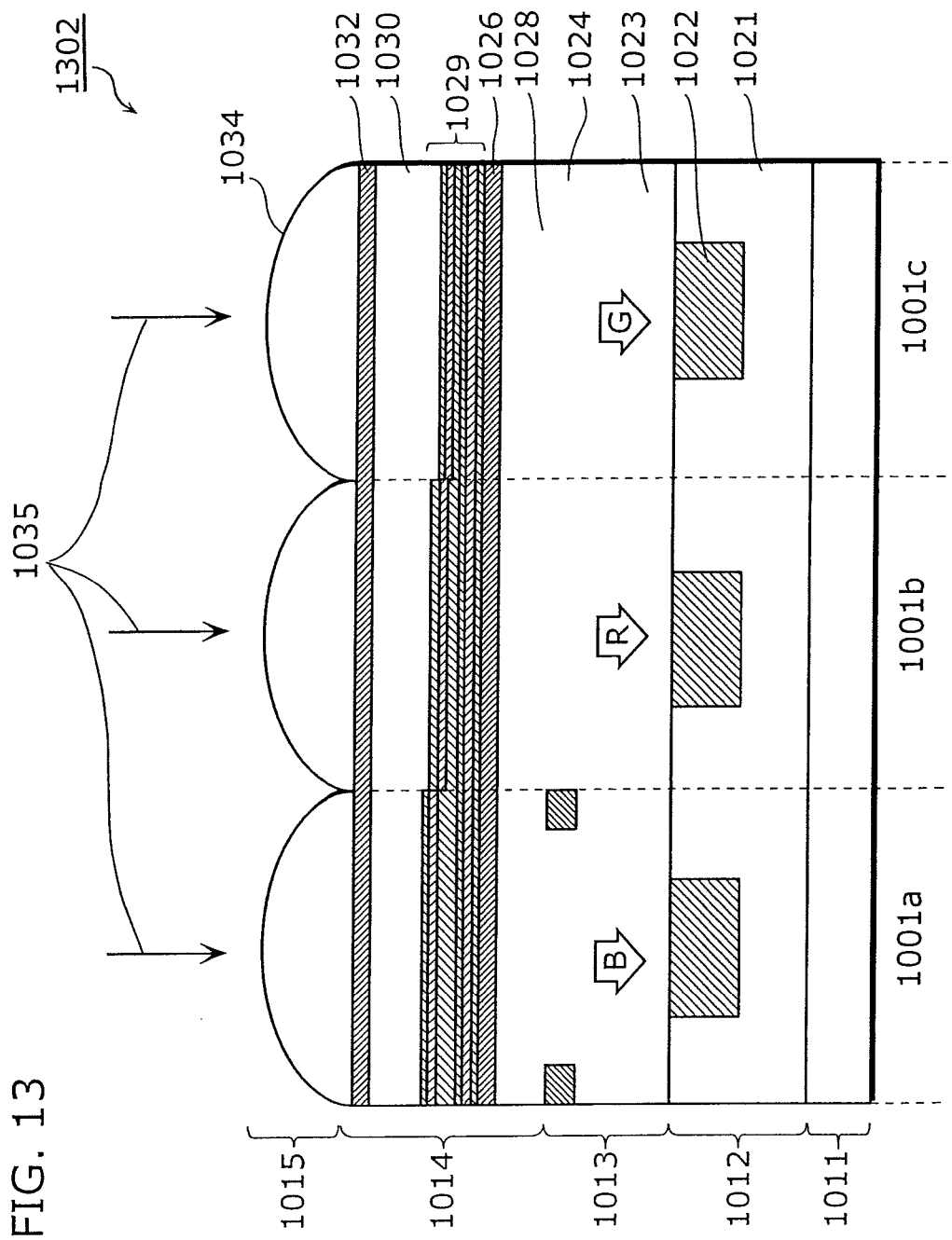

US 7,701,024 B2

SOLID-STATE IMAGING DEVICE, MANUFACTORING METHOD THEREOF AND CAMERA

BACKGROUND OF THE INVENTION (1) Field of the Invention

The present invention relates to a solid-state imaging device, a camera and so on which uses the solid-state imaging device, and in particular to a color filter included in the solid-state imaging device.

(2) Description of the Related Art

In recent years, the range of application for solid-state imaging devices such as digital still cameras, digital video cameras and cellular phones has been expanding rapidly and coloration technology has become essential technology in any field.

FIG. 1 is a diagram which shows part of a cross section structure (more specifically, three unit pixels) of a conventional solid-state imaging device 6. As shown in FIG. 1, the pixel portion of the solid-state imaging device 6 has a structure in which a P-type semiconductor layer 602, an inter-layer insulation film 604, a color filter 606 with a multi-layer film structure and a micro-lens 607 are laminated sequentially on an N-type semiconductor layer 601. Note that a photodiode 603 is formed on a side of the inter-layer insulation film 604 in the P-type semiconductor layer 602, and a light shielding film 605 is formed on the inter-layer insulation film 604.

Incident light on the solid-state image device 6 is collected by the micro-lens 607 and, after being separated into specific colors by the color filter 606, enters the photodiode 603 (see for example, Patent Document "International Pamphlet Publication No. 05/069376").

Color separation is realized using the color filter, and a page of image data can be generated by accumulating the above photoelectrically converted signal in all of the unit pixels (see for example, patent documents "Japanese Patent Publication No. 7-311310", "Japanese Patent Publication No. 2000-180621" or "International Pamphlet Publication No. 05-069376").

In order to protect pixel units and circuit units, normally a tri-silicon tetra-nitride film is formed as a barrier film (known as a "protection film") in the solid-state imaging device. Subsequently for example by composing the color filter in the solid-state imaging device by layering a silicon oxide nitride film and a tri-silicon tetra-nitride film, incident light reflection can be controlled (see for example, Patent Document "Japanese Patent Publication No. "2000-252451").

Conventionally, improvement in image quality has always been in demand, and increases in the amount of pixels and color reproducibility are also in demand.

However, there is the problem that an adequate color reproducibility cannot be obtained by the conventional solid-state imaging device 6. The problem is explained below by making use of the drawings.

FIG. 5C is a diagram which shows a conceptual structure of the color filter 606 included in the conventional solid-state imaging device 6. Additionally, FIG. 5D is a diagram which shows the color separation characteristic of the color filter 606.

In the conventional color filter 606 shown in FIG. 5C, the transmission band for blue (a property curve 424) is narrow and the color reproducibility is poor in the same way as the color separation characteristic is shown in FIG. 5D. In other words, there is the problem that although the structure of the conventional color filter 606 can be thinned, an adequate color reproducibility cannot be obtained.

Further, sometimes when a multi-layer film interference filter which includes a protection filter (see for example Patent Document "International Pamphlet Publication No. 05-069376") is used as the color filter (generally, the color filter is formed using laminated film of low refractive index material and high refractive index materials, however a protection film such as a barrier film is formed outside the color filter), the protection film produces adverse effects for the color filter (see for example Patent Document "International Pamphlet Publication No. 05-069376").

In addition, when a set wavelength of the color filter is not appropriate for the film thickness of the barrier film, "interference" is generated and the color separation characteristic (also known as the transmission spectra) for the incident light is affected. In addition, there is a large effect on the position and color separation characteristic of the barrier film.

Further, when a planarizing layer and so on is formed using Chemical Mechanical Polishing (CMP), there is the problem that the color separation characteristic will vary due to the increase in film thickness variation.

SUMMARY OF THE INVENTION

The present invention is realized in view of the problems above, and takes as a primary object providing a solid-state imaging device and so on which includes a color filter with excellent color reproducibility.

Further the present invention takes as a second object providing a solid-state imaging device which includes a color filter which can reduce the effects of interference that appear due to a planarizing layer and a barrier film and further, can control variation in the color separation characteristic due to film thickness variation in the planarizing layer, when the multi-layer film interference filter is used as the color filter.

In order to accomplish the objects above, the solid-state imaging device according to the present invention is a solid-state imaging device in which unit pixels are arranged in a two-dimensional shape, the unit pixels including a color filter, through which light of a predetermined color in incident light passes, the color filter including: when a set wavelength is A, a first layer made of high refractive index material having a first optical film thickness of $\lambda/4$; a second layer made of low refractive index material having a second optical film thickness of $\lambda/4$ equal to the first optical film thickness; and a dielectric layer for controlling the light which passes through and which has a different film thickness from the first optical film thickness and the second optical film thickness; wherein a plurality of three layer films are arranged in the color filter, each of the three layer films being formed by laminating the first layer, the dielectric layer and the first layer respectively.

Thus, it is possible to provide a solid-state imaging device which includes a color filter that has excellent color reproducibility.

Additionally, in order to accomplish the object above, the manufacturing method for the solid-state imaging device according to the present invention is a manufacturing method for a solid-state imaging device in which unit pixels are arranged in a two-dimensional shape, the unit pixels including a color filter, through which light of a predetermined color in incident light passes, the manufacturing method comprising: forming a first layer made of high refractive index material having a first optical film thickness; forming a second layer made of low refractive index material having a second optical film thickness; and forming a third layer for controlling the light which passes through and which has a third film thickness which differs from the first optical film thickness and the second optical film thickness; forming a fourth layer for controlling the light which passes through and which has a fourth film thickness which differs from the first optical film thickness and the second optical film thickness. Further, in the manufacturing method for the solid-state imaging device according to the present invention, the optical film thickness of the third layer and the fourth layer is formed approximately equal.

Thus, a solid-state image device which includes a color filter with excellent color reproducibility can be manufactured.

Additionally, the solid-state imaging device according to the present invention further includes a barrier film with an optical film thickness approximately equal to $\lambda/2$.

By utilizing the structure above, the effects of interference due to the barrier film besides the color filter can be reduced and when a barrier film besides a color filter is included, a superior camera can be realized as a total device.

Additionally, the barrier film is characterized by being adjacent to the color filter. By utilizing the structure above, the effects of the planarizing layer on interference generated between the color filter and a barrier film outside the color filter can be removed and a superior color separation characteristic can be realized.

Additionally, an antireflection film with an optical film thickness approximately equal to $\lambda/4$ is formed on at least one of the top surface and the bottom surface of the barrier film. Using the above structure, variation in the color separation characteristic caused by variation in the film thickness, which stems from the element planarizing stage (CMP method), can be controlled. Further, it is possible to improve the transmittance using the effects of the antireflection film and to realize a solid-state imaging device with high sensitivity.

Additionally, an antireflection film with an optical film thickness approximately equal to $\lambda/4$ is formed on the color filter side of the barrier film. Using the above structure, variation in light separation caused by variation in the film thickness, which stems from the element planarizing stage, can be controlled. Further, the transmittance can be further improved by forming the antireflection film on only the filter side, thereby realizing a highly sensitive solid-state imaging device.

Additionally, the barrier film is made up of the first barrier film on the incident light side of the color filter and the second barrier film on the light projection side of the color filter. The film thickness of the first barrier film and the second barrier film are equal. Using the above structure, it is possible to improve the symmetry of the color filter and to improve the light transmittance. Therefore, a highly sensitive solid-state imaging device can be realized.

Additionally, the barrier film is a tri-silicon tetra-nitride film. By utilizing the structure above, a solid-state imaging device with high reliability which includes a tri-silicon tetra-nitride film can be realized by the barrier effect of the tri-silicon tetra-nitride film. Further, the barrier film can realize functions of an etching stop layer during etching.

Additionally, the antireflection film is a silicon oxide nitride film. By utilizing the above structure, the refractive index of the silicon oxide nitride film is lower than that of the tri-silicon tetra-nitride film and the tri-silicon tetra-nitride film is useful as an antireflection film since the refractive index of the silicon oxide nitride film is greater than the silicon dioxide element used in the planarizing layer and so on.

Additionally, the barrier film is a silicon oxide nitride film. By utilizing the structure above, the effect of interference can be reduced since the reflectance at the interface of the silicon dioxide is decreased due to variation in the film thickness since the difference in the refractive index between the silicon oxide nitride film and the silicon dioxide used in the planarizing layer is smaller than that of the tri-silicon tetra-nitride film.

Note that the present invention can be realized as a camera which includes the solid-state imaging device.

According to the present invention, color reproducibility can be improved in the color filter by expanding the transmittance bandwidth of each color light by introducing two spacer layers i.e. a third and a fourth layer, with film thicknesses which differ from the predetermined $\lambda/4$ that has been determined beforehand.

Additionally, since the present invention is structured in the same way as the optical film thickness of the third layer and the fourth layer, the maximum value of the transmittance in the color separation characteristic can be raised and a solid-state imaging device having high sensitivity can be realized.

Additionally, since the color filter according to the present embodiment is structured to be vertically symmetrical, it is possible to increase the transmittance rate of the color filter to the maximum value 100% and to realize a solid-state imaging device that has high sensitivity.

Further, when a multi-layered film interference filter is used as the color filter, the solid-state imaging device according to the present invention can realize a solid-state imaging device capable of reducing the effects of interference by the planarizing layer and the barrier film due to the film thickness of the barrier film being set to $\lambda/2$, and further, can control variation in the characteristic caused by film thickness variation in the planarizing layer by forming an antireflection film on the barrier film.

FURTHER INFORMATION ABOUT TECHNICAL BACKGROUND TO THIS APPLICATION

The disclosure of Japanese Patent Application No. 2007-009428 and 2006-336255 filed on Jan. 18, 2007 and Dec. 13, 2006 respectively including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 3 is a diagram which shows a conceptual structure of the solid-state imaging device included in the digital still camera according to the present invention;

FIG. 4 is a cross-section diagram which shows a part of the solid-state imaging device according to the present invention;

FIG. 11 is a base cross-section diagram which shows the structure of the unit pixels according to the fourth embodiment;

FIG. 13 is a base cross-section diagram which shows the structure of the unit pixels according to the fifth embodiment;

DESCRIPTION OF THE PREFERRED EMBODIMENT(S)

Below, an embodiment of a solid-state imaging device and a camera according to the present invention is described in detail with reference to the diagrams by taking a digital camera as an example. Note that the present invention is explained using the embodiments below as well as the drawings attached, however this explanation is an example and the present invention is not limited to this.

First Embodiment

Figure 1:
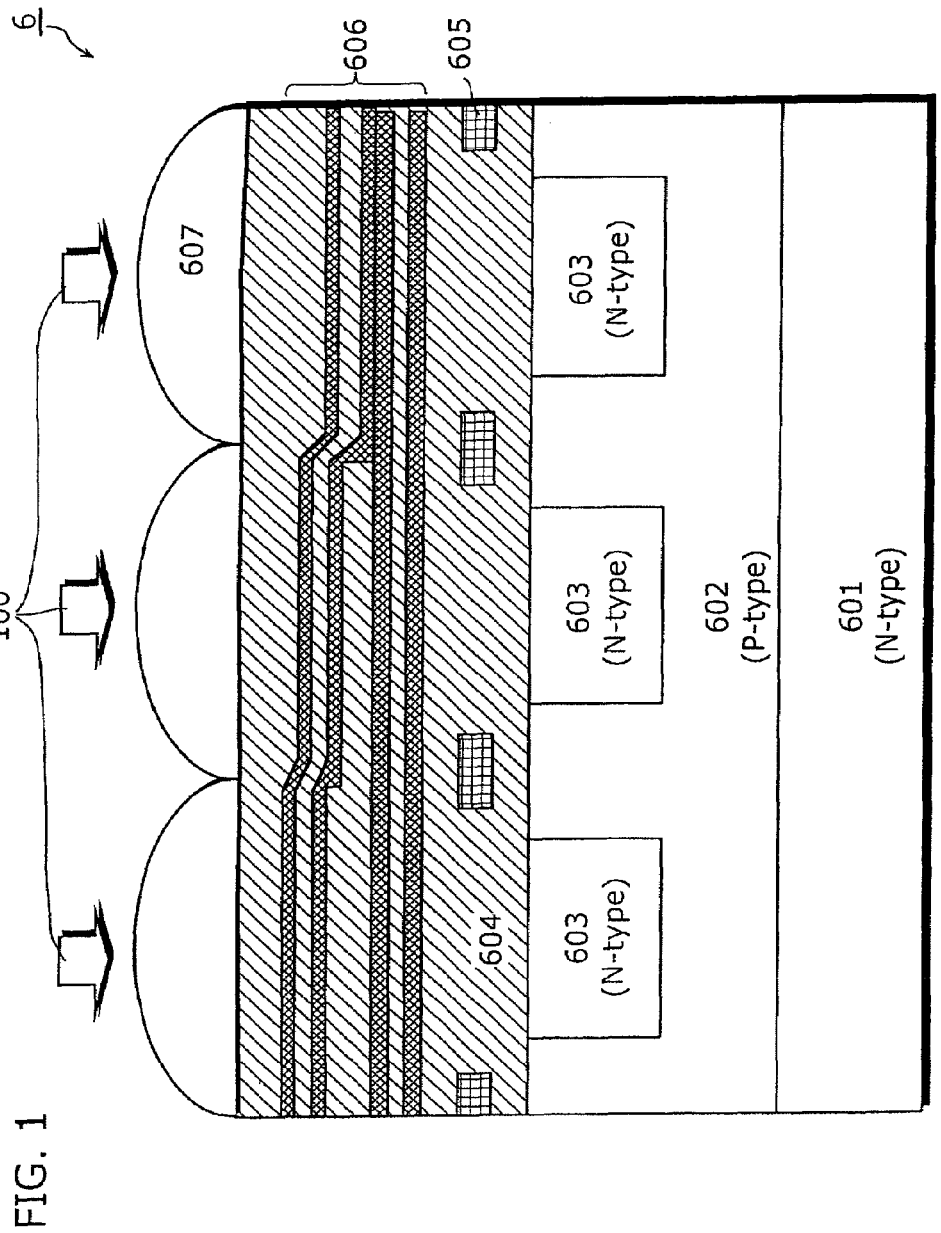
FIG. 1 is a cross-section diagram which shows a partial structure of a conventional solid-state imaging device.
Figure 2:
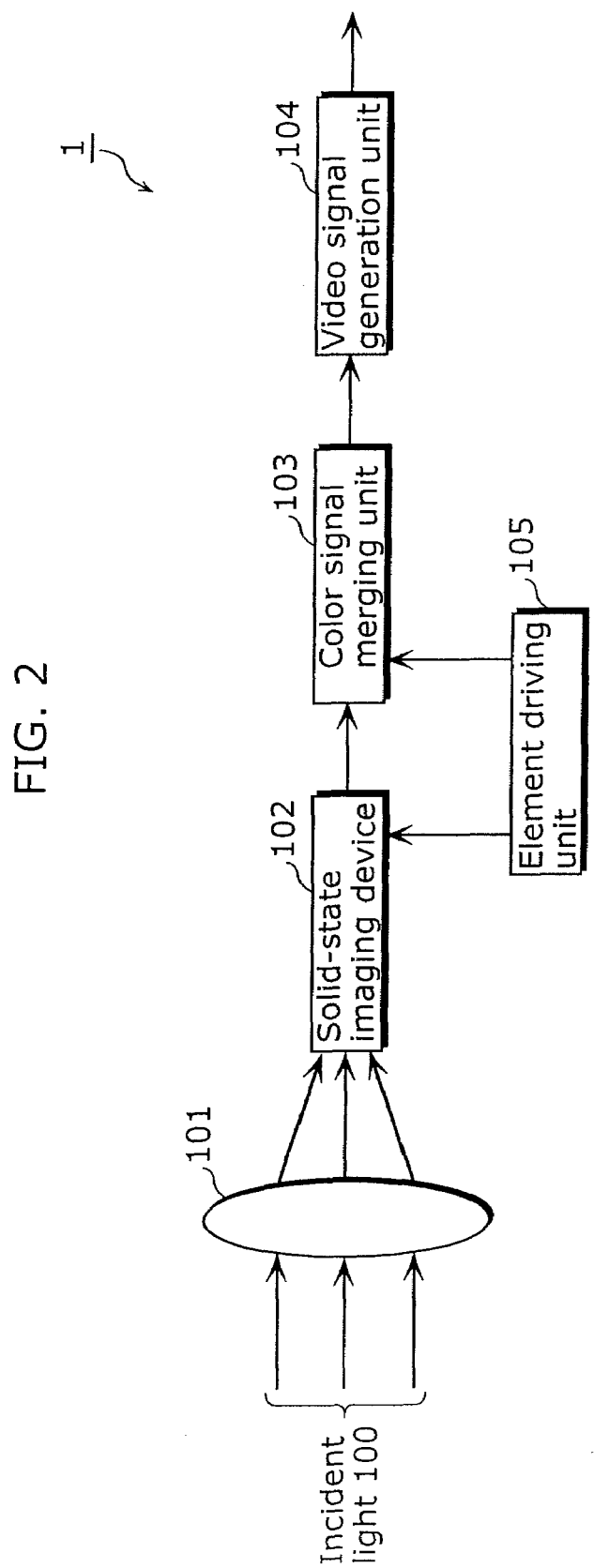
FIG. 2 is a block diagram which shows the functional structure of the digital still camera according to the present invention.

First, the structure of the digital still camera according to the present invention is explained. FIG. 2 is a block diagram which shows the critical functional structure of a digital still camera 1 according to the present invention.

As shown in FIG. 2, the digital still camera 1 includes a lens 101, a solid-state imaging device 102, a color signal merging unit 103, a video signal generation unit 104 and an driving unit 105.

The lens 101 is an imaging lens. The light 100 incident on the digital still camera 1 is focused onto the imaging area of the solid state imaging device 102. The solid-state imaging device 102 is a unit which generates a color signal by photoelectrically converting light collected by the lens 101. The driving unit 105 is a unit which extracts a color signal from the solid-state imaging device 102. The color signal merging unit 103 is a unit which performs color shading on the color signal obtained from the solid-state imaging device 102. The video signal generation unit 104 is a unit which generates a color video signal from the color signal on which color shading has been performed in the color signal merging unit 103. Note that the color video signal is finally recorded to a recording medium such as a RAM or a memory card as color image data.

Next, the structure of the solid-state imaging device 102 according to the present invention is described.

FIG. 3 is a diagram which shows a conceptual structure of the solid-state imaging device 102. As shown in FIG. 3, in the solid-state imaging device 102, each row of the unit pixels 201 (16 of the unit pixels 201 are shown typically in FIG. 3) arranged in a two-dimensional shape is selected by a vertical shift register 202, the row signal is selected by a horizontal shift register 203, and a color signal for each unit pixel 201 is outputted from the output amp 204. Note that the driving circuit 205 drives the vertical shift register 202, the horizontal shift register 203 and the output amp 204.

FIG. 4 is a cross-section diagram which shows a part of the solid-state imaging device 102 according to the present invention (more specifically, three unit pixels 201). As shown in FIG. 4, the solid-state imaging device 102 is made up of a P-type semiconductor layer 302, an inter-layer insulation film 304, a color filter (also known as a "multi-layer film interference filter") 306, and a micro-lens 307 laminated sequentially on an N-type semiconductor layer 301. Note that a photodiode 303 created by implanting N-type impurities is created for each unit pixel on the inter-layer insulation film 304 side of the P-type semiconductor layer 302. Further, a P-type semiconductor layer is interposed between adjacent photodiodes 303, and this is known as an isolation region.

Additionally, a light shielding film 305 is formed in the inter-layer insulation film 304. Further, each photodiode 303 is in a corresponding relationship with the micro-lenses 307, and the light shielding film 305 is formed in order to prevent light which has passed through the micro-lens 307 from being incident on a photodiode 303 that is not in a corresponding relationship (in other words, is adjacent).

The color filter 306 consists of the following layers: first layers 402, 404, 406 and 408, a second layer 405, a third layer 407, and a fourth layer 403. The first layers 402, 404, 406, 408 and second layer 405 have an optical film thickness of approximately ¼ of λ when the wavelength of the incident light is a set wavelength λ (for example, 530 [nm]). The dielectric 3 layer is made up of three layers: first layer 404, and 406 and second layer 405. The third layer 407 and the fourth layer 403 are spacer layers (also known as "defective layers" or "resonance layers"). The dielectric layers 404, 405 and 406, are sandwiched between a third layer 407 and a fourth layer 403, and further, sandwiched by the above λ/4 layer 402 and 408.

In other words, the third layer (spacer layer) 407 is sandwiched by the first layer 406 and 408, fourth layer (spacer layer) 403 is also sandwiched by the first layer 402 and 404, which make up first 3 layers and second 3 layers, respectively. The second layer 405 is arranged between the first 3 layers and second 3 layers.

As shown in FIG. 4, the number of layers is 7 in the present embodiment. Here, "optical film thickness" is a value obtained by multiplying the physical thickness by the refractive index.

Among the two layer types in which the refractive index differs, the first layer 402, 404, 406 and 408 are made up of high refractive index material (more specifically titanium oxide ($TiO_2$)), and the second layer 405 is made up of low refractive index material (more specifically silicon dioxide ($SiO_2$)).

The third layer 407 and the fourth layer 403 have an optical film thickness corresponding to the light that passes through. Additionally, the physical film thickness of the entire color filter 306 differs for every light which passes through, and the red area, the green area and the blue area are 389 [nm], 669 [nm], and 579 [nm] respectively. In other words, the third layer 407 and the fourth layer 403, which are spacer layers, are layers used for controlling light to be passed through, and by changing the film thickness of the spacer layers, blue or green light in the red light is passed through.

Next, the design result calculated using the matrix method on the color separation characteristic of the color filter 306 according to the present invention, is explained.

Figure 5A:
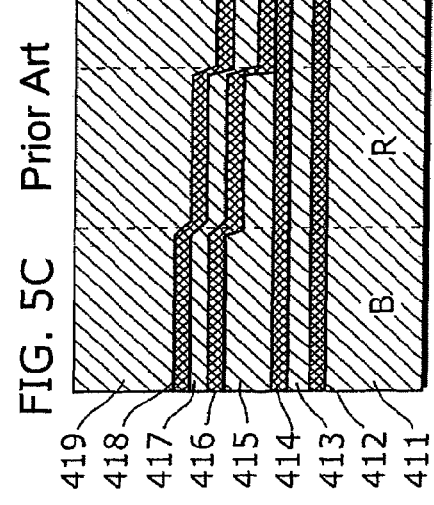
FIG. 5A is a diagram which shows a conceptual structure of the color filter included in the solid-state imaging device according to the present invention.
Figure 5B:
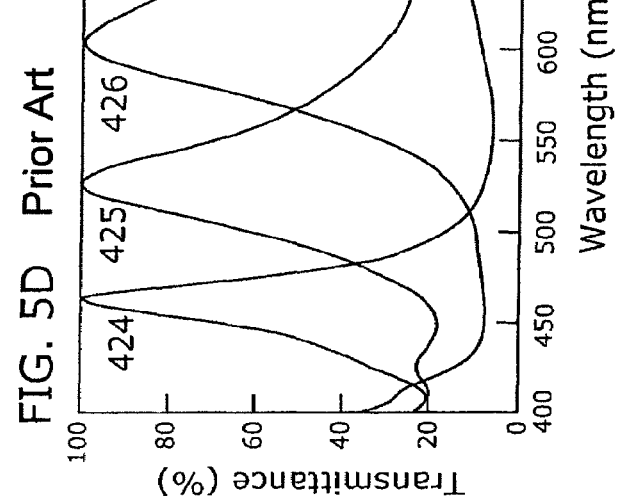
FIG. 5B is a diagram which shows the color separation characteristic of the color filter according to the present invention.
Figure 5C:
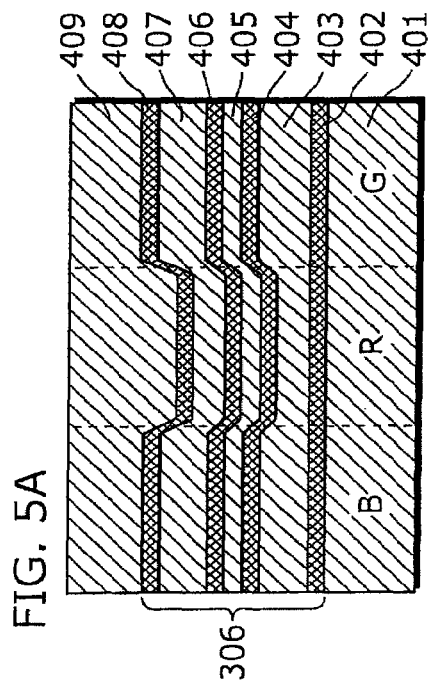
FIG. 5C is a diagram which shows a conceptual structure of the color filter included in the conventional solid-state imaging device.
Figure 5D:
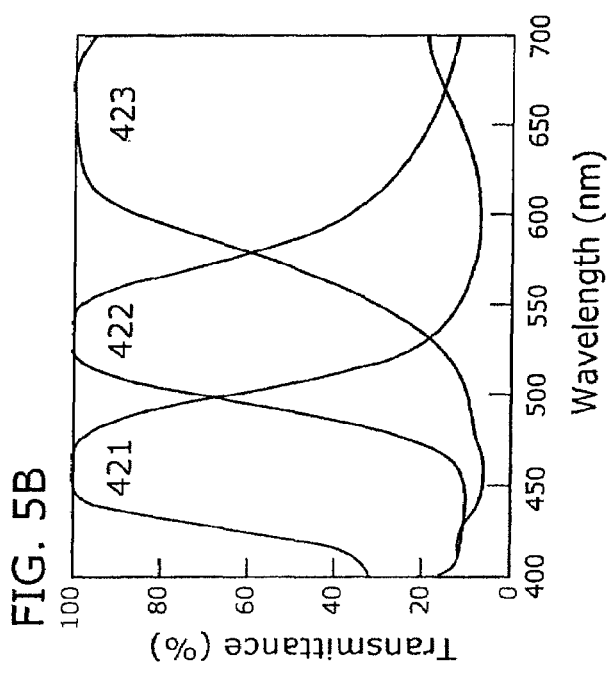
FIG. 5D is a diagram which shows the color separation characteristic of the conventional color filter.

FIG. 5A is a diagram which shows a conceptual structure of the color filter 306 with two spacer layers according to the present invention, and FIG. 5B is a diagram which shows the color separation characteristic of the color filter 306. Additionally, FIG. 5C is a diagram which shows a conceptual structure of a color filter 606 with 1 conventional spacer layer, and FIG. 5D is a diagram which shows the color separation characteristic of the color filter 606. In both FIG. 5B and FIG. 5D, the vertical axis expresses the transmittance and the horizontal axis expresses the wavelength of light.

The color filter 306 consists of following layers. The dielectric 3 layer consists of dielectric layers 404 through 406 (404: titanium dioxide 52 [nm], 405: silicon dioxide 91 [nm], 406: titanium dioxide 52 [nm]), which are made up of the first layers 404 and 406 made up of titanium dioxide which is a high refractive index material, and a second layer 405 made up of silicon dioxide which is a low refractive index material. The first layer and the second layer have the same optical film thickness in either area. A third layer 407 and a fourth layer 403 (the third layer 407, the fourth layer 403: silicon dioxide (blue area: 140 nm, red area: 45 nm, green area: 185 nm)) are formed on both sides of the 3 layer. The third layer 407 and the fourth layer 403 being spacer layers having respectively equal film thicknesses, and being made of silicon dioxide, which is a low refractive index material. Further, the first layers 408 and 402 (together, 52 [nm]), made of titanium dioxide which is a high refractive index material, are formed on both sides of the third layer 407 and the fourth layer 403.

The color filter 306 in the solid-state imaging device 102 is formed on the substrate 401 and further, a TEOS planarizing layer 409 is formed on the color filter 306. Thus, the set wavelength "λ" above is 530 [nm]. By composing the color filter 306 as above, color separation can only be achieved by changing the film thicknesses of the third layer 407 and the fourth layer 403.

Note that as shown in FIG. 5C, in the conventional color filter 606, dielectric layers 412 through 414 (412: titanium dioxide 52 [nm], 413: silicon dioxide 91 [nm], 414: titanium dioxide 52 [nm]) are formed on a substrate 411 and further a spacer layer 415 (titanium dioxide (blue area: 133 [nm], red area: 31 [nm], green area: 0 [nm])) with a different film thickness for each unit pixel is formed on the substrate 411. Dielectric layers 416 through 418 (416: titanium dioxide 52 [nm], 417: silicon dioxide 91 [nm], 418: titanium dioxide 52 [nm]) are formed on the spacer layer 415. Note that a TEOS planarizing layer 419 is formed on the color filter 606.

In FIG. 5B, the characteristic curve 421, 422 and 423 indicate color separation characteristics of blue, green and red color filter 306, respectively. Additionally, in FIG. 5D, the characteristic curve 424, 425, and 426 indicate color separation characteristic of blue area, green and red color filter 606, respectively.

Note that when calculating the color separation characteristic, the set wavelength "λ" is 530 [nm] in FIG. 5A and FIG. 5C.

Here, the third layer 407 and the fourth layer 403 have the structure above, however the optical film thickness of the third layer 407 and the fourth layer 403 corresponding to the red color filter is 0 through λ/4, the optical film thickness of the third layer 407 and the fourth layer 403 corresponding to the blue color filter is λ/4 through λ/2, and the optical film thickness of the third layer 407 and the fourth layer 403 corresponding to the green color filter is about equal to λ/2 of the optical film thickness. By setting the third layer 407 and the fourth layer 403 to the above film thickness, a high transmittance can be achieved.

When the conventional color filter has one spacer layer as shown in FIG. 5C, as shown in FIG. 5D, the transmittance bandwidth of blue color filter is narrow in comparison to the transmission bandwidth of the green color filter or the red color filter. Further, in the spectrum of the characteristic curve 425 for the green color filter, the transmittance increases for colors other than green (especially red).

In contrast, as shown in FIG. 5A, when the present invention has a structure with two spacer layers, although the number of layers 7 is the same as the conventional art, it is possible to expand (improve) the transmission bandwidth for all colors, as shown in FIG. 5B.

Further, the light transmittance for light of wavelength bands other than wavelength bands to be passed through can be reduced when the color filter 306 according to the present invention is used. For example, for the green color filter (characteristic curve 422), light with a transmittance of no less than wavelength 600 nm or no more than 450 nm decreases compared to the characteristic curve 425.

As above, since the color filter 306 according to the present invention has superior color separation properties (color separation characteristic), the digital still camera 1 can capture a digital image which faithfully reproduces the color.

Next, a manufacturing method for the color filter 306 according to the present invention is explained.

FIGS. 6A through 6I is a diagram which shows several processes for manufacturing the color filter 306. In FIG. 6, the manufacturing process of the color filter 306 progresses from 6A to 6I. Additionally, the N-type semiconductor layer 301, the P-type semiconductor layer 302, the photodiode 303 and the light shielding layer 305 are not shown.

Figure 6F:
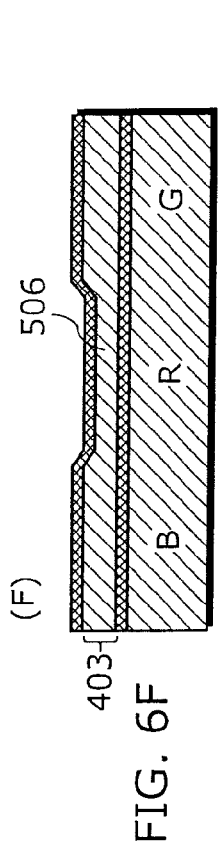
FIGS. 6A through 6I are diagrams which show several processes for manufacturing the color filter according to the present invention.
Figure 6G:
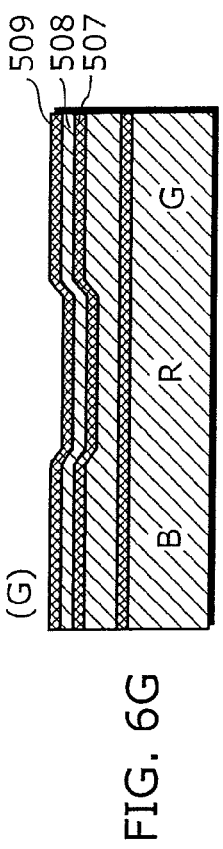
Figure 6H:
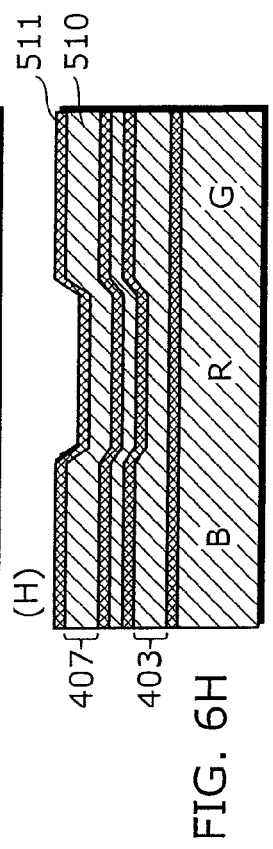
Figure 6I:
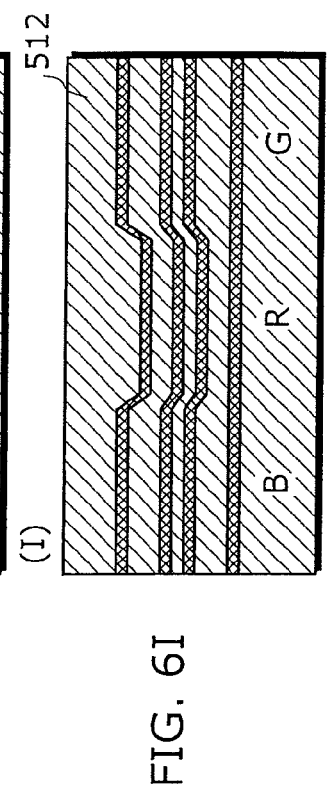
Figure 6A:
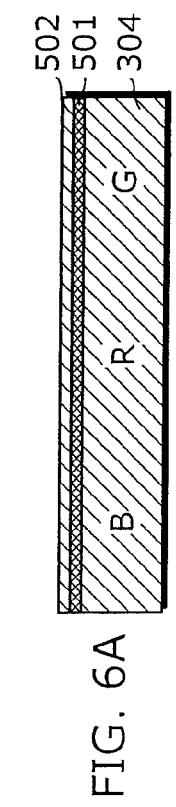

First, a titanium dioxide layer 501 and a silicon dioxide layer 502 are formed on the inter-layer insulation film 304 using a high-frequency spattering system (FIG. 6A). Here, the titanium dioxide layer 501 is a λ/4 film, and the film thickness is 52 [nm] and the silicon dioxide layer 502 is 45 [nm].

Figure 6B:
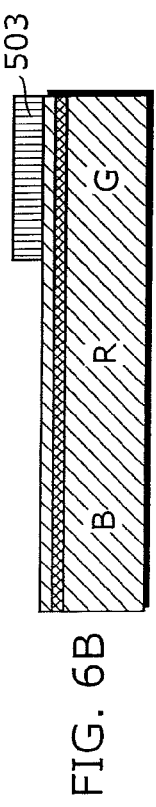

Next, in order to selectively remove the silicon dioxide layer 502 for each unit pixel, a resist 503 is formed on the green area (FIG. 6B).

In order to form the resist 503, for example a resist material is applied to the wafer surface, and after a pre-exposure bake (pre-bake), exposure may be performed by an exposure system such as a stepper, and resist development and a final bake (post bake) may be performed. Subsequently, the silicon dioxide layer 502 can be selectively etched using methane fluorine 4 ($CF_4$)-type etching gas.

Figure 6C:
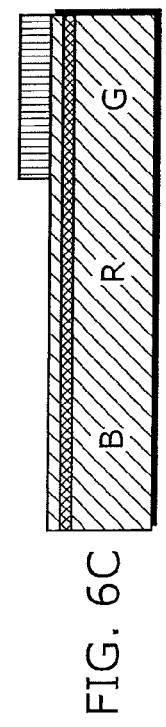

Subsequently, a silicon dioxide layer 502 other than the unit pixel region corresponding to green is etched and removed (FIG. 6C).

Figure 6D:
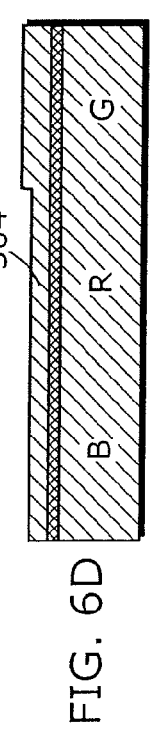

Next, the resist 503 is removed and the silicon dioxide layer 504 is formed on the silicon dioxide layer 502 using a high frequency spattering system (FIG. 6D). Here, the silicon dioxide layer 504 is 95 [nm].

Figure 6E:
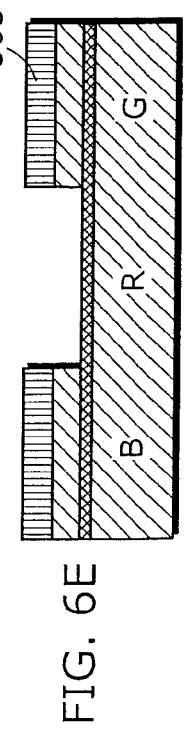

Next, the resist 505 is formed on the blue area and the green area in order to selectively remove the silicon dioxide layer 504 (FIG. 6E).

Further, the resist 505 is removed and a silicon dioxide layer 506 is formed on the silicon dioxide layer 504 using a high frequency spattering system (FIG. 6F). Here, the silicon dioxide layer 506 is 45 [nm]. The film thicknesses of the silicon dioxide layer 506 and the silicon dioxide layer 502 are the same. Thus, costs can be reduced since the film formation process can be carried out in common. Here, fourth layers 403 (blue area: 140 [nm], green area: 185 [nm], red area: 45 [nm]) which correspond to each unit pixel are formed.

Next, a dielectric layer is formed after laminating the titanium dioxide layer 507, the silicon dioxide 508 and the titanium dioxide layer 509 sequentially on the silicon dioxide layer 506 using the high frequency spattering system (FIG. 6(g)). Here, the titanium dioxide layers 507 and 509 are λ/4 films, and the film thickness is 52 [nm], or the silicon dioxide layer 508 is a λ/4 film and the film thickness is 91 [nm].

Subsequently, in the same way as FIGS. 6A through 6F, a third layer 510 is formed and a titanium dioxide layer 511 is formed (FIG. 6 (h)). Thus a third layer 407 is formed, and third layers 407 corresponding to each pixel (blue area: 140 [nm], green area: 185 [nm], red area: 45 [nm]) are formed. Each film thickness in the third layer 407 and the fourth layer 403 is the same in each color region. The titanium dioxide layer 511 is a λ/4 film, and the film thickness is 52 [nm]. Subsequently, in order to form the micro-lens 607, a TEOS planarizing layer 512 is formed.

A color filter 306 is formed by using the above process.

(Modification)

Above, an embodiment according to the present invention is described, however the present invention is of course not limited to the above embodiment and a color filter may be realized according to the present invention using the modification shown below.

(1) In the above embodiment, an embodiment which utilizes titanium dioxide as material with a high refractive index is described, however the present invention is not limited to this and instead, the following structure may be utilized.

In other words, instead of using titanium dioxide (refractive index: 2.53), other materials such as tri-silicon tetra-nitride ($Si_3N_4$) (refractive index: 2.00), di-tantalum penta-oxide ($Ta_2O_5$) (refractive index: 2.16), di-niobium penta-oxide ($Nb_2O_5$) (refractive index: 2.33), and zirconium dioxide (ZrO) (refractive index: 2.05) may be used. Additionally, materials with a low refractive index other than silicon dioxide may be used.

(2) In the above embodiment, the dielectric layer is composed of three layers: the first layer 404, the second layer 405 and the first layer 406, however even if the dielectric layer is made up of only the first layer of titanium dioxide, the dielectric layer may be composed of a 5 layer or 7 layer structure in which the first and second layers are laminated alternately. Note that when there are more than 3 layers, the color separation properties improve and when there is one layer, a high transmittance can be obtained.

(3) In the above embodiment, a spacer layer has been explained for the case in which the third layer and the fourth layer are both attached, however the present invention is not limited to this and the number of spacer layers may be changed according to the color of passing light.

(4) In the above embodiment, the case in which the color filter has 7 layers in total is explained, however it goes without saying that the present invention is not limited to this and instead of 7, the number of layers may be less than or exceed 7. Note that when the number of layers exceeds 7, a peak caused by the defect level appears.

(5) In the above embodiment, the film thickness of the two types of spacer layer (in other words, the third layer and the fourth layer) is the same for each unit pixel, however it goes without saying that the present invention is not limited to this and the film thickness of the third layer and the fourth layer may differ.

(6) In the above embodiment, a symmetrical structure is explained in which the color filter is formed around the dielectric layer made up of the first layer and the second layer, however it goes without saying that the present invention is not limited to this and a non-symmetrical structure may be used.

(7) In the above embodiment, an embodiment which utilizes silicon dioxide as spacer layer material is described, however the present invention is not limited to this and instead, other optical transmission material may be used. Additionally, spacer layer material may utilize the same material as one of the high refractive index layer and the low refractive index layer which make up the dielectric layer. Additionally, as above, different material from the two spacer layers may be used.

(8) In the above embodiment, although not specifically stated, unit pixels for each color may for example be arranged in a Beyer pattern. In this case, a color that takes up two pixels in a rectangular area made up of four pixels may be a color which has the narrowest transmission bandwidth for the color separation characteristic. In this way, a shortage of light caused by narrowness of the transmission bandwidth can be corrected by increasing the number of pixels.

Second Embodiment

Figure 7A:
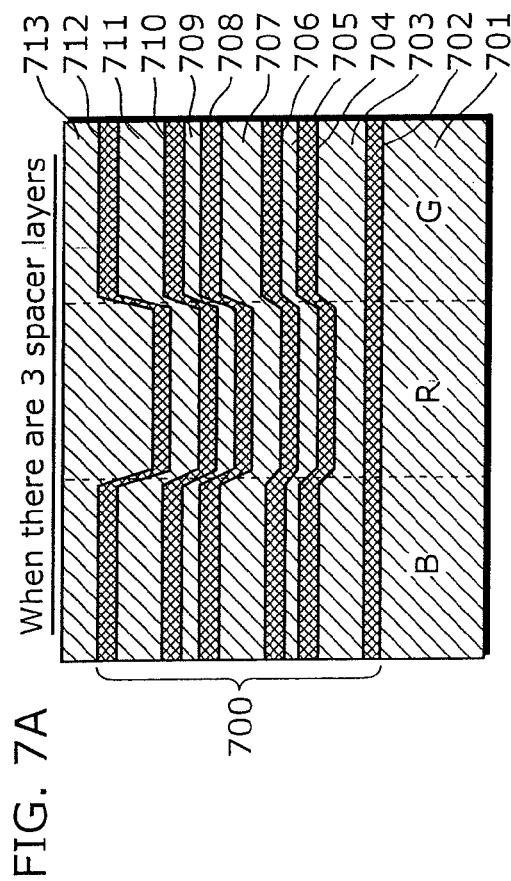
FIG. 7A is a diagram which shows a conceptual structure of the color filter included in the solid-state imaging device according to the present invention.
Figure 7C:
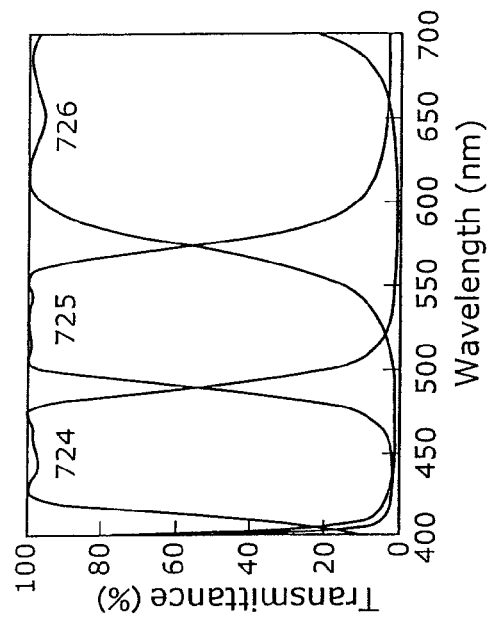
FIG. 7C is a diagram which shows the color separation characteristic in the modification of the color filter according to the present invention.
Figure 7B:
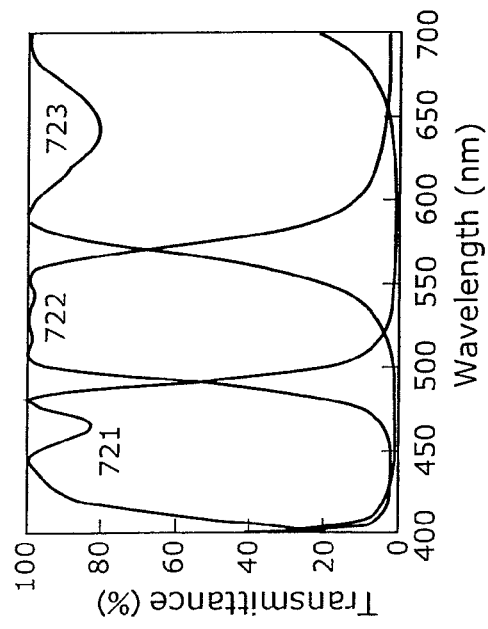
FIG. 7B is a diagram which shows the color separation characteristic of the color filter according to the present invention.

FIG. 7A is a diagram which shows a conceptual structure of a color filter 700 in which there are three spacer layers according to the present invention, and FIG. 7B is a diagram which shows the color separation characteristic of the color filter 700. Additionally, FIG. 7C shows the color separation characteristic of the modification of the structure in FIG. 7A. In both FIG. 7B and FIG. 7C, the vertical axis expresses the transmittance and the horizontal axis expresses the wavelength of the transmitted light. In the present embodiment, the color filter 700 has three spacer layers, which differs from the first embodiment above. The other structural elements are the same as in the first embodiment, and thus the explanation is not repeated.

The color filter 700 includes first layers 702, 704, 706, 708, 710 and 712 made up of titanium dioxide which is a high refractive index material (first layer 702, 704, 706, 708, 710, 712: titanium dioxide 52 [nm]), second layers 705 and 709 made up of silicon dioxide which is a low refractive index material (second layer 705 and 709: silicon dioxide 91 [nm]), and a spacer layer; a fifth layer 707, a sixth layer 711 and a seventh layer 703 made up of silicon dioxide which is a low refractive index material (a fifth layer 707, a sixth layer 711 and a seventh layer 703: silicon dioxide (blue area: 130 nm, red area: 45 nm, green area: 182 nm)). The first and second layers have an optical film thickness equal to $\lambda/4$ ($\lambda$:530 nm) in any of the areas. The fifth layer 707, sixth layer 711 and seventh layer 703 film thicknesses are mutually equal.

As shown in FIG. 7B, the structure of the color filter is as follows: the first layers 708 and 706 are arranged on both sides of the fifth layer 707, the second layers 709 and 705 are further arranged on both sides of the first layers 708 and 706, further the first layers 710 and 704 are arranged on both sides of the second layers 709 and 705, further the sixth layer 711 and the seventh layer 703 are arranged on both sides of the first layers 710 and 704, and further, the first layers 712 and 702 are arranged on both sides of the sixth layer 711 and the seventh layer 703.

As above, the color filter 700 is formed on the substrate 701 and further, a TEOS planarizing film 713 is formed on the color filter 700. Thus, the set wavelength "$\lambda$" is 530 [nm] in the present embodiment. By using the structure above, color separation can only be realized by changing the film thickness of the fifth layer 703, the sixth layer 711 and the seventh layer 711.

In FIG. 7B, characteristic curves 721, 722 and 723 indicate the color separation characteristic of blue, green and red color filter 700, respectively. Note that when calculating the color separation characteristic, the set wavelength "$\lambda$" is 530 [nm] in FIG. 7A.

Here, the optical film thickness of the fifth layer 707, the sixth layer 711 and the seventh layer 703 corresponding to the red area is 0 through $\lambda/4$, the optical film thickness of the fifth layer 707, the sixth layer 711 and the seventh layer 703 corresponding to the blue area is $\lambda/4$ through $\lambda/2$, and the optical film thickness of the fifth layer 707, the sixth layer 711 and the seventh layer 703 corresponding to the green area is about equal to $\lambda/2$ of the optical film thickness. In this way, by setting the fifth layer 707, the sixth layer 711 and the seventh layer 703 to the film thickness above, a color filter can be realized which includes an excellent color separation characteristic.

When the conventional color filter has one spacer layer as shown in FIG. 5C, as shown in FIG. 5D, the transmittance bandwidth of blue color filter is narrow in comparison to the transmission bandwidth of the green color filter or the red color filter. Further, in the spectrum of the characteristic curve 425 for the green color filter, the transmittance increases for colors other than green (especially red).

In contrast, as shown in FIG. 7B, compared to the color filter 306 in FIG. 4 with two spacer layers, the color filter 700 with three spacer layers, the characteristic curve 721 in the green area has a transmittance of nearly 0 in colors besides green (blue, red), and further it is clear that the color separation characteristic improves.

(Modification)

Above, a color filter according to the present embodiment is described, however the present invention is of course not limited to the above embodiment and a color filter may be realized according to the present invention by the modification shown below.

FIG. 7C shows the characteristic in the color filter having three spacer layers in the second embodiment, for when the film thickness of the spacer layer is set to the film thicknesses shown below.

In other words, the film thicknesses of the fifth layer 707 in the red area, the fifth layer 707 in the blue area and the fifth layer 707 in the green area are 55 nm, 125 nm and 182 nm, respectively. Additionally, the sixth layer 711 in the red area, the sixth layer 711 in the blue area and the sixth layer 711 in the green area are 40 nm, 135 nm and 182 nm respectively. Further, the seventh layer 703 in the red area, the seventh layer 703 in the blue area and the seventh layer 703 in the green area are 40 nm, 135 nm and 182 nm respectively. Thus, the film thickness of the sixth layer 711 and the seventh layer 703 is the same in at least all colors. Additionally, in the green region, all the film thicknesses are equal.

By using the above film thickness, it is possible to realize a vertically symmetrical color filter and to increase the maximum transmittance to 100%. Further, by setting the film thickness of the fifth layer 707 and the seventh layer 703 to the same film thickness, the film thickness of the sixth layer 711 is made different and thus reductions of the transmittance caused by interference of light in the transmission band which occur in red and blue in FIG. 7B can be controlled.

(1) In the above embodiment, an embodiment which utilizes titanium dioxide as material with a high refractive index is described, however the present invention is not limited to this and instead, the following structure may be utilized.

In other words, instead of using titanium dioxide (refractive index: 2.53), other materials such as tri-silicon tetranitride ($Si_3N_4$) (refractive index: 2.00), di-tantalum pentaoxide ($Ta_2O_5$) (refractive index: 2.16), di-niobium pentaoxide ($Nb_2O_5$) (refractive index: 2.33), and zirconium dioxide (ZrO) (refractive index: 2.05) may be used. Additionally, materials with a low refractive index other than silicon dioxide may be used.

(2) In the above embodiment, a spacer layer has been explained for the case of three layers; a fifth layer, a sixth layer and a seventh layer. However, it goes without saying that the present invention is not limited to this and instead the number of spacer layers may be changed according to the color of passing light.

(3) Additionally, the above embodiment is explained for the case where the color filter has 11 layers, however it goes without saying that the present invention is not limited to this and instead of 11 layers, less than or more than 11 layers may be included. Additionally, the above embodiment is explained for the case where the color filter includes three spacer layers, however it goes without saying that the present invention is not limited to this and instead, four or more layers may be included.

(4) In the above embodiment, the film thickness of the three types of spacer layer (in other words, the fifth layer, the sixth layer and the seventh layer) is the same for each basis pixel, however it goes without saying that the present invention is not limited to this and that the film thickness of the third layer, the fourth layer and the fifth layer may differ.

(5) In the above embodiment, the case in which the color filter is made up of a first layer and a second layer and is composed symmetrically around the fifth layer is explained; however it goes without saying that the present invention is not limited to this and that the color filter may have an asymmetrical structure.

(6) In the above embodiment, a case in which silicon dioxide is utilized as spacer layer material is described, however it goes without saying that the present invention is not limited to this and instead, other optical transmission material may be used. Additionally, spacer layer material may utilize the same material as one of the high refractive index layer and the low refractive index layer which make up the dielectric layer, and may utilize differing materials. Additionally, as above, different material in the three spacer layers may be used.

(7) In the above embodiment, although not specifically stated, basis pixels for each color may for example be arranged in a Beyer pattern.

Third Embodiment

Note that the structure of the digital still camera and a conceptual structure of the solid-state imaging device according to the present embodiment have the same content as FIG. 2 or FIG. 3 in the first embodiment above.

Figure 8:
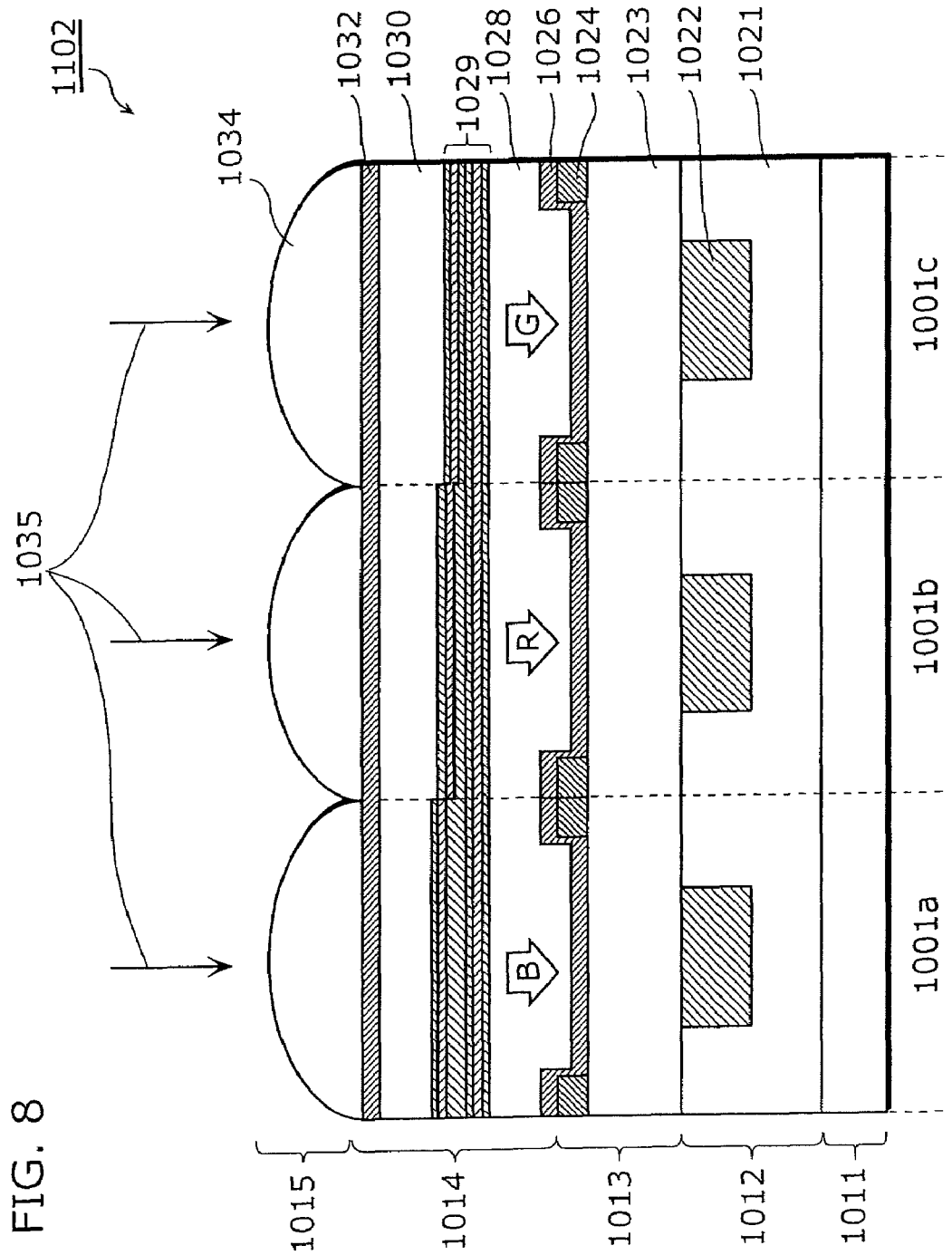
FIG. 8 is a base cross-section diagram which shows the structure of unit pixels according to the third embodiment.

FIG. 8 is a base cross-section diagram which shows a partial structure (more specifically, the three unit pixels, 1001a, 1001b and 1001c) of the solid-state imaging device 1102 according to the present embodiment. Each unit pixel 1001a through 1001c is formed based on a substrate 1011 made of silicon into which an N-type impurity is added, and has each of the below layers.

The photoelectric conversion layer 1012 includes a P-type well 1021 formed by performing ion implantation of P-type impurities into the substrate 1011, and a photoelectric conversion unit 1022 which is an N-type area formed by ion implantation of N-type impurities into the P-type well 1021.

The metal layer 1013 is a layer formed when wiring from the vertical shift register 202, wiring in which the signal charge is transferred to the horizontal shift register 203 and so on, is formed by the CVD method (Chemical Vapor Deposition) and so on. Additionally, the light shielding film 1024 is formed using the CVD method, and silicon dioxide 1023, used for planarizing the element, is formed by the CVD method in an opening of the light shielding film 1024. An aperture for guiding light into the unit pixel is included in the light shielding film 1024.

The filter layer 1014 includes a tri-silicon tetra-nitride film 1026 which is a barrier film, a silicon dioxide 1028 for planarizing an element, a color filter 1029 made of a multi-layer film interference filter, silicon dioxide 1030 for planarizing the color filter 1029 and a tri-silicon tetra-nitride film 1032 which is a barrier film when etching backwards during formation of the micro-lens 1034.

Note that an incident light 1035 enters the top of the unit pixel, collected by a micro-lens 1034 and reach the photoelectric conversion unit 1022 after passing through the filter layer 1014 and the metal layer 1013.

Next, the color separation characteristic of the solid-state imaging device 1102 according to the present embodiment is described.

Figure 9A:
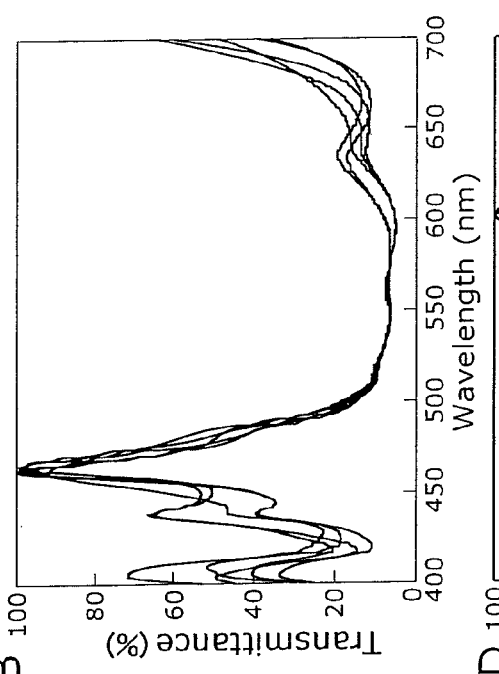
FIGS. 9A through 9D is a diagram which shows the color separation characteristic in the unit pixel according to the third embodiment.

FIGS. 9A through 9D is a diagram which shows the color separation characteristic of each unit pixel 1001a through 1001c in the solid-state imaging device 1102 according to the present embodiment. FIG. 9A shows the color separation characteristic of the solid-state imaging device 1102 when the film thickness of the first barrier film 1026 and the second barrier film 1032 has the same film thickness, and when the set wavelength of the color filter 1029 ($\lambda$) is 530 nm, the thickness of the $\lambda/2$ film is 133 nm.

In the color filter 1029, the set wavelength ($\lambda$) is 530 nm, the film thickness of the $\lambda/4$ film titanium dioxide is 52 nm, and the film thickness of the $\lambda/4$ film silicon dioxide is 91 nm.

The unit pixel 1001c corresponding to Red (R) light has a structure of $TiO_2$(52 nm)/$SiO_2$(91 nm)/$TiO_2$(52 nm)/$SiO_2$(30 nm)/$TiO_2$(52 nm)/$SiO_2$(30 nm)/$TiO_2$(52 nm)/$SiO_2$(91 nm)/$TiO_2$(52 nm). Additionally, the unit pixel 1001c corresponding to Green (G) light has a structure of $TiO_2$(52 nm)/$SiO_2$(91 nm)/$TiO_2$(52 nm)/$SiO_2$(0 nm)/$TiO_2$(52 nm)/$SiO_2$(91 nm)/$TiO_2$(52 nm). Further, the unit pixel 1001a corresponding to Blue (B) light has a structure of $TiO_2$(52 nm)/$SiO_2$(91 nm)/$TiO_2$(52 nm)/$SiO_2$(133 nm)/$TiO_2$(52 nm)/$SiO_2$(91 nm)/$TiO_2$(52 nm).

By changing the film thickness only one layer of a $SiO_2$ spacer layer (133 nm in the unit pixel 1001a B, 30 nm in the unit pixel 1001b (R) and 0 nm in the unit pixel 1001c (G)), RGB color separation can be realized.

Figure 9B:
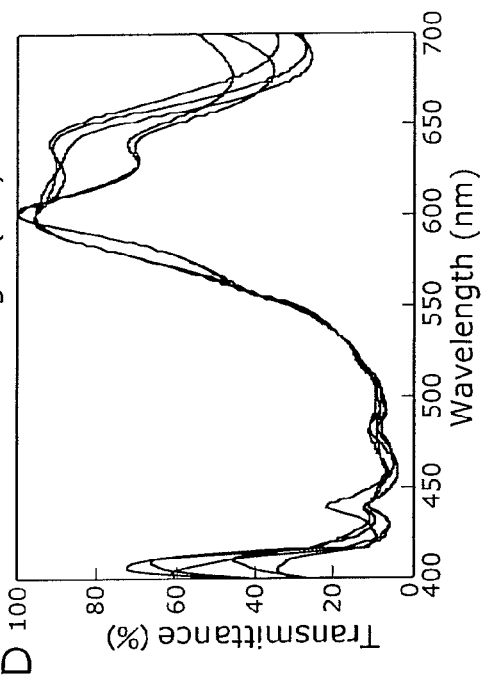
Figure 9C:
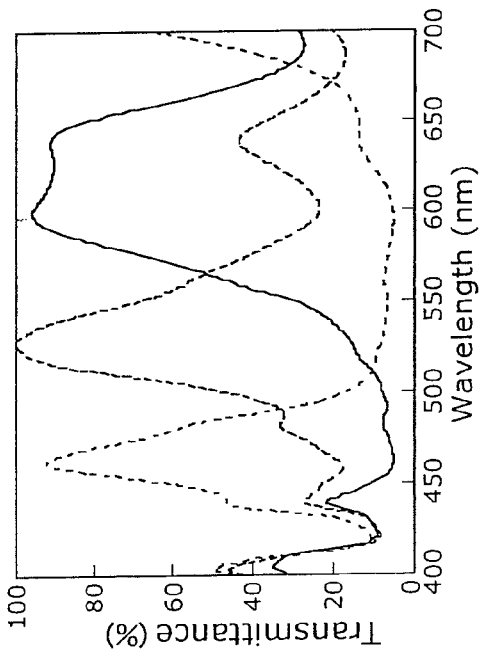
Figure 9D:
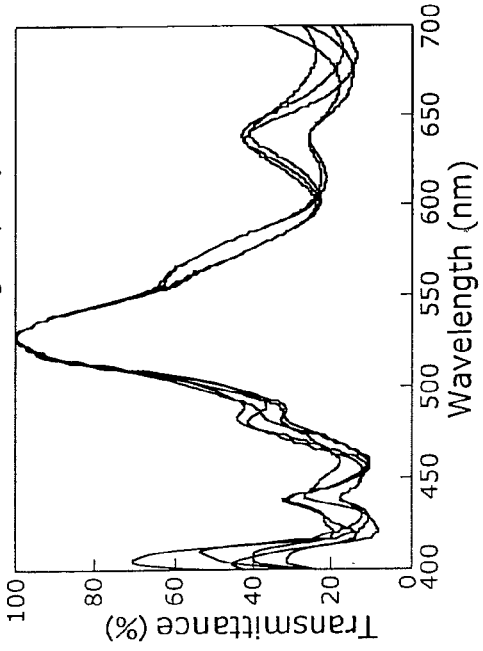

Note that in FIGS. 9B through 9D, the color separation characteristic of the solid-state imaging device 1102 according to the present embodiment is shown for the unit pixel 1001a for B light, the unit pixel 1001b for R light and the unit pixel 1001c for G light, when the film thickness of each silicon dioxide 1030 planarizing layer (500 nm) is changed by −200 nm, −100 nm, 0 nm, +100 nm and +200 nm respectively.

Figure 10A:
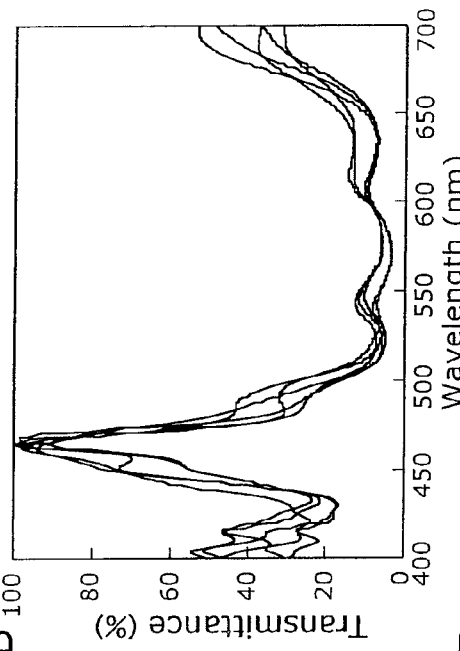
FIGS. 10A through 10D are diagrams which show the color separation characteristic when the film thickness of the tri-silicon tetra-nitride film has been changed in the third embodiment.
Figure 10B:
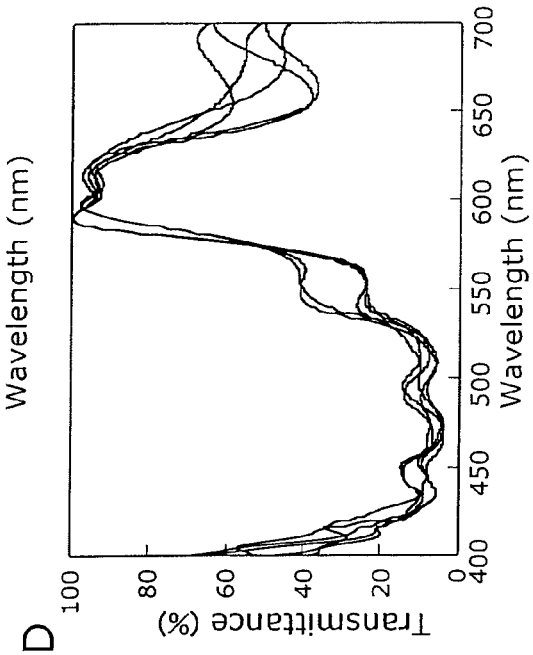
Figure 10C:
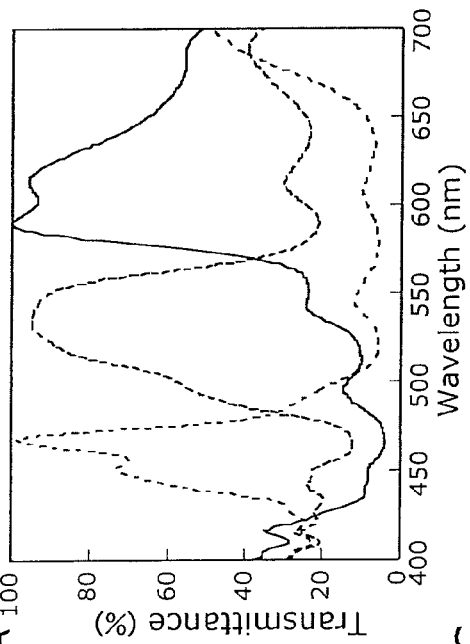
Figure 10D:
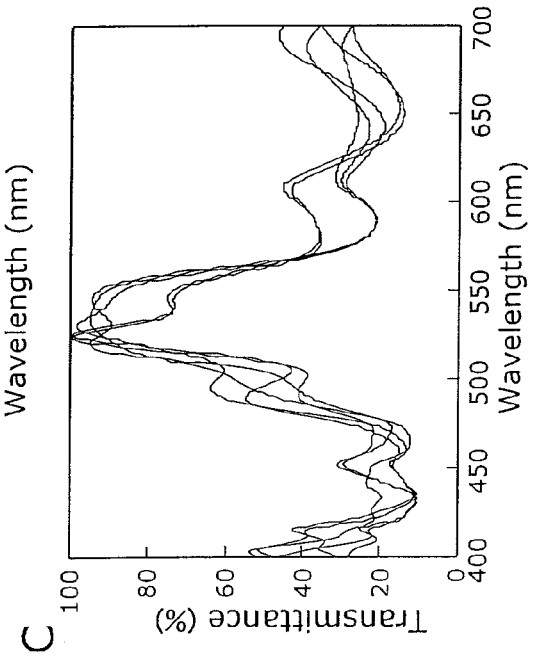

FIG. 10A shows the color separation characteristic when the film thickness of the tri-silicon tetra-nitride film 1032, which is a first barrier film, changes from 133 nm to 50 nm (there is no change when the thickness of the tri-silicon tetra-nitride film 1026, which is a second barrier film, is 133 nm). In this case, a ripple affects the spectrum due to the effect of interference by the tri-silicon tetra-nitride film and an excellent color separation characteristic cannot be realized. Note that FIGS. 10B through 10D show the color separation characteristic in the same way as FIG. 10A for the unit pixel 1001a for B light, the unit pixel 1001b for R light and the unit pixel 1001c for G light, when the film thickness of the tri-silicon tetra-nitride film 1032 changes from 133 nm to 50 nm, and the film thickness of each silicon dioxide 1030 planarizing layer is changed by −200 nm, −100 nm, 0 nm, +100 nm and +200 nm respectively.

As above, by including a color filter according to the present embodiment, the effects of interference in the color separation characteristic of G light can be reduced and a solid-state imaging device which has an excellent color separation characteristic can be realized.

Fourth Embodiment

FIG. 11 is a cross-section diagram which shows the structure of the base pixels (1001a, 1001b and 1001c) in the solid-state imaging device 1202 according to the present embodiment. The unit pixels 1001a through 1001c according to the present embodiment differ from the unit pixels 1001a through 1001c according to the third embodiment in that the silicon oxide nitride layers 1025 and 1027, which are antireflection films, and the silicon oxide nitride layers 1031 and 1033 are formed on the top surface and the bottom surface of each of the first barrier film 1026 and the second barrier film 1032. The other structural elements are the same as in the third embodiment, and thus their explanation is not repeated.

Thus, the refractive index of the above silicon oxygen layers 1025, 1027, 1031 and 1033 is "1.56". Additionally, the film thicknesses of the silicon oxide nitride layers are the same and the film thickness of the $\lambda/4$ film with the set wavelength 530 nm in the color filter 1029 is 85 nm.

FIGS. 12A through 12D are diagrams which show the color separation characteristic of each unit pixel (1001a, 1001b and 1001c) in the solid-state imaging device 1202 according to the present embodiment.

Figure 12A:
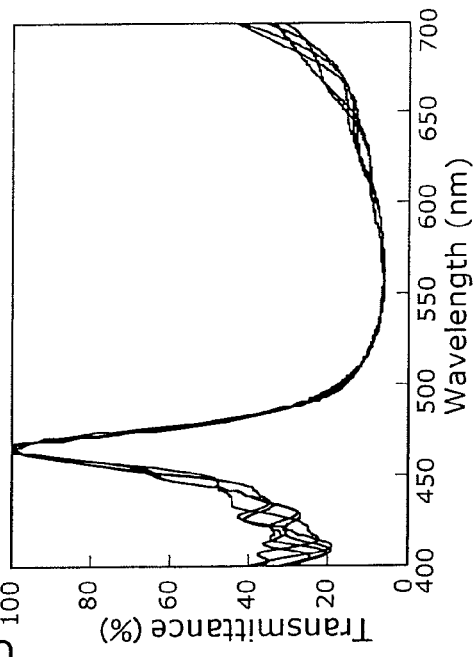
FIGS. 12A through 12D is a diagram which shows the color separation characteristic in the unit pixel according to the fourth embodiment.

Comparing FIG. 12A and the color separation characteristic shown in the third embodiment in FIG. 9A, it is clear that the color separation characteristic of the solid-state imaging device 1202 according to the present invention reduces the effect of interference owing to the effect of the antireflection film.

Figure 12B:
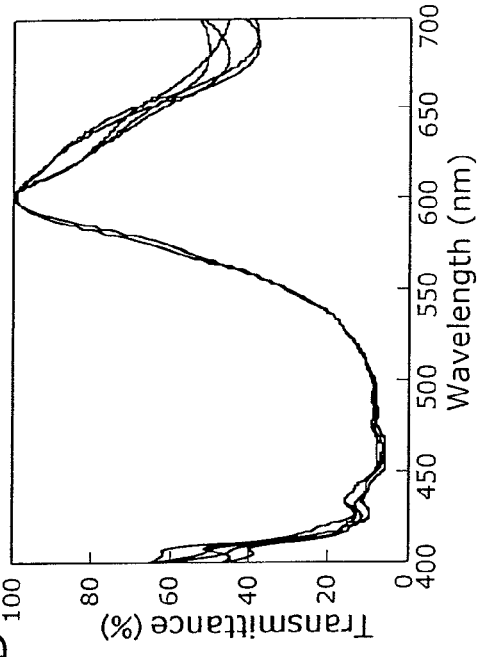
Figure 12C:
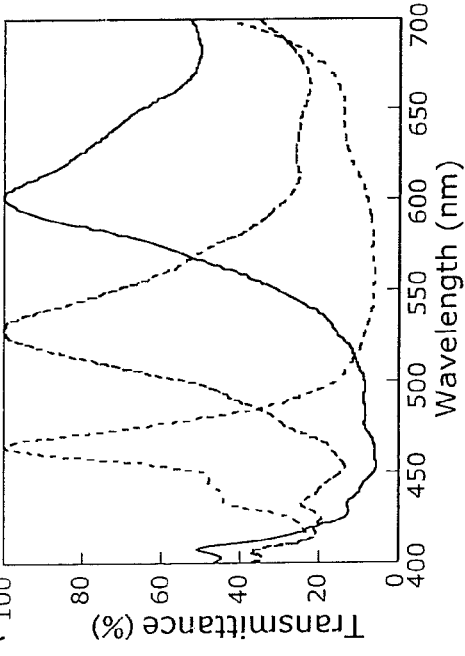
Figure 12D:
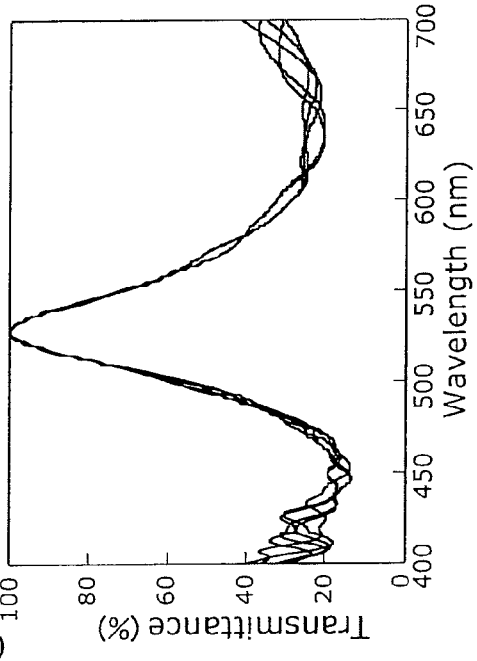

Note that FIGS. 12B through 12D show the color separation characteristic in the unit pixel 1001*a* for B light, the unit pixel 1001*b* for R light and the unit pixel 1001*c* for G light in FIG. 12A above, when the film thickness of the silicon dioxide film 1030 (500 nm) planarizing layer is changed respectively by −200 nm, −100 nm, 0 nm, +100 nm and +200 nm.

Thus, the silicon dioxide 1030 is a layer for planarizing the color filter 1029 and is formed generally by using CMP. Since variation in film thickness for CMP technology is generally around ±200 nm, even when the film thickness of silicon dioxide 1030 has been changed, the solid-state imaging device 1202 according to the present embodiment can reduce the affects of film thickness variation when compared to FIGS. 12B through 12D. In the same way, the silicon dioxide 1028 is a layer for planarizing differences caused by the light shielding layer 1024, and the affect of variation in the film thickness can be reduced by forming the antireflection film in the same way.

Fifth Embodiment

FIG. 13 is a substrate cross-section diagram which shows the structure of the base pixels (1001*a*, 1001*b* and 1001*c*) in the solid-state imaging device 1302 according to the present embodiment. The unit pixels 1001*a* through 1001*c* according to the present embodiment differ from the third embodiment in that the silicon oxide nitride layer 1026 second barrier film is connected to the color filter 1029. The other structural elements are the same as in the third embodiment, and thus the explanation is not repeated.

Figure 14A:
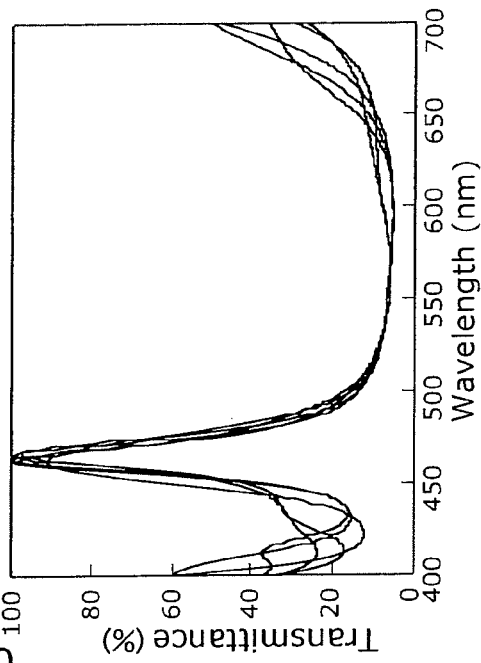
FIGS. 14A through 14D is a diagram which shows the color separation characteristic of the unit pixel according to the fifth embodiment.
Figure 14B:
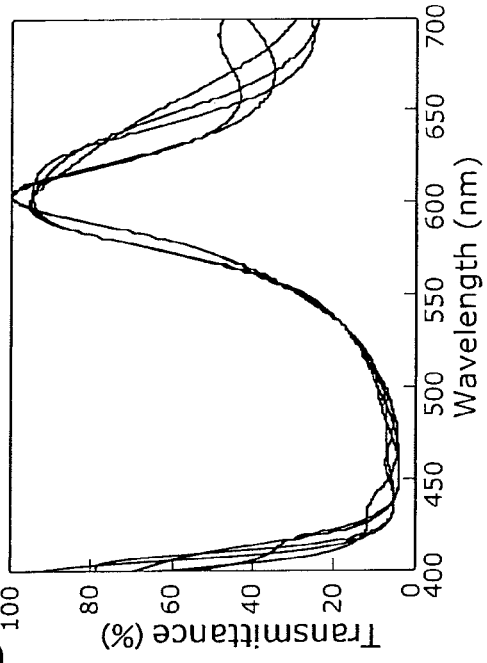
Figure 14C:
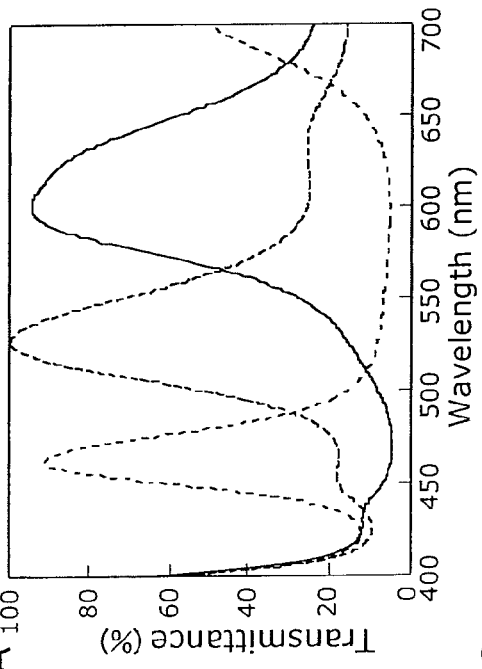
Figure 14D:
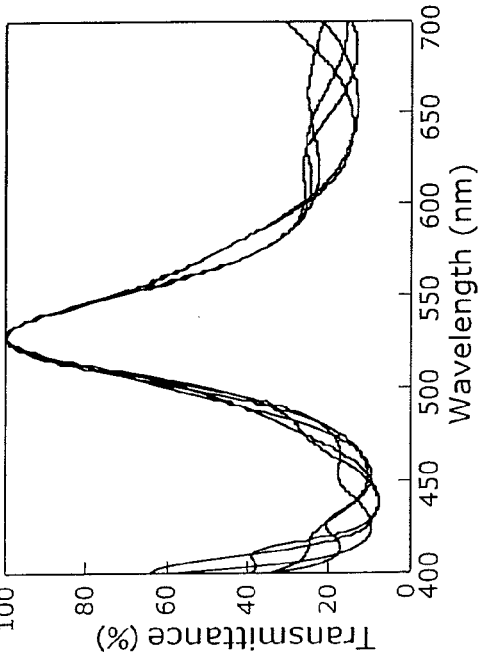

FIG. 14A is a diagram which shows the color separation characteristic of each unit pixel (1001*a*, 1001*b*, and 1001*c*) in the solid-state imaging device 1302 according to the present embodiment. Note that FIGS. 14B through 14D show the color separation characteristic for the unit pixel 1001*a* for B light, the unit pixel 1001*b* for R light and the unit pixel 1001*c* for G light in the structure in FIG. 13 above, when the film thickness of each silicon dioxide film 1030 (500 nm) planarizing layer is changed by −200 nm, −100 nm, 0 nm, +100 nm and +200 nm respectively.

In the third embodiment, although there is some effect of film thickness variation due to the silicon dioxide 1028 being placed between the color filter 1029 and the tri-silicon tetranitride film 1026, when the structure shown in FIG. 13 is used, the planarizing layer 1028 made up of silicon dioxide is formed directly after the light shielding layer 1024 is formed, and since the first barrier film 1026 and the color filter 1029 are formed adjacent to each other, the effects of film thickness variation on the color separation characteristic due to the use of CMP can be removed. Therefore, excellent light separation can be achieved.

Sixth Embodiment

Figure 15:
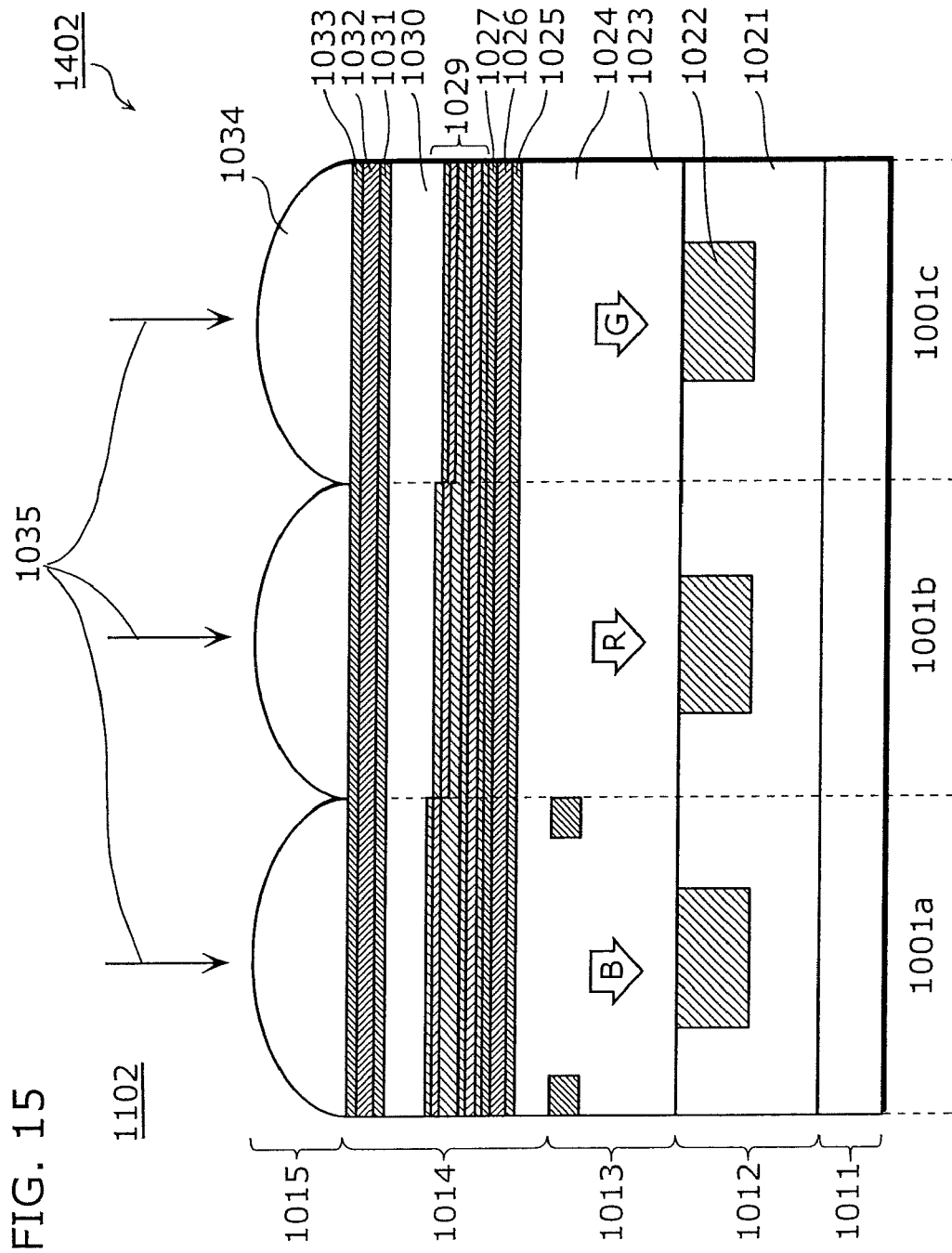
FIG. 15 is a base cross-section diagram which shows the structure of the unit pixels according to the sixth embodiment.

FIG. 15 is a substrate cross-section diagram which shows the structure of the base pixels (1001*a*, 1001*b* and 1001*c*) in the solid-state imaging device 1402 according to the present embodiment. The unit pixels 1001*a* through 1001*c* according to the present embodiment differ from the fifth embodiment above in that the silicon oxide nitride films 1025, 1027, and the silicon oxide nitride films 1031 and 1033 are formed on the top surface and the bottom surface of each barrier film as antireflection films in the first barrier film 1026 and the second barrier film 1032. The other structural elements are the same as in the fourth embodiment, and thus their explanation is not repeated.

Figure 16B:
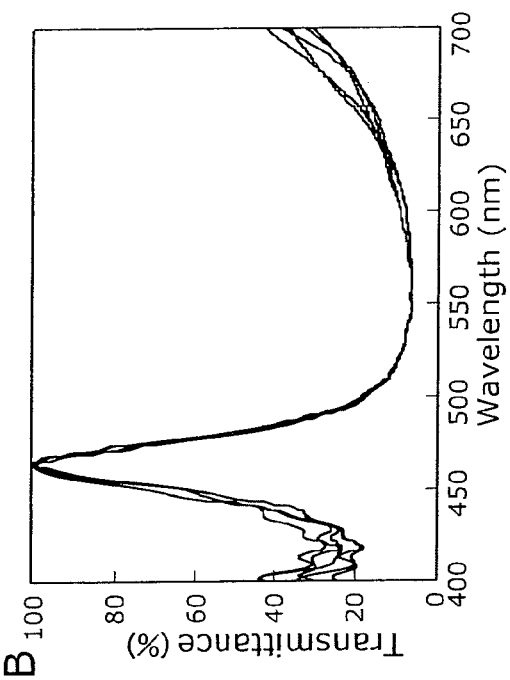
FIGS. 16A through 16D are diagrams which show the color separation characteristic in the unit pixel according to the sixth embodiment.
Figure 16D:
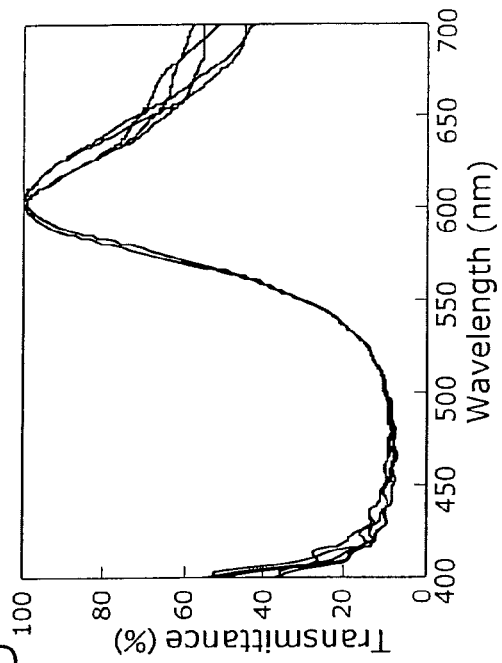
Figure 16A:
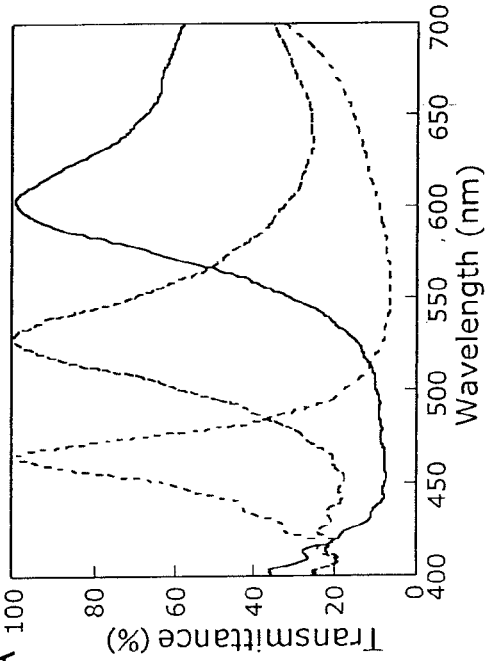

FIG. 16A is a diagram which shows the color separation characteristic for each unit pixel (1001*a*, 1001*b* and 1001*c*) in the solid-state imaging device 1402 according to the present embodiment. Even when the structure in FIG. 15 is used, the affects of interference can be further decreased, and excellent color separation can be realized.

Figure 16C:
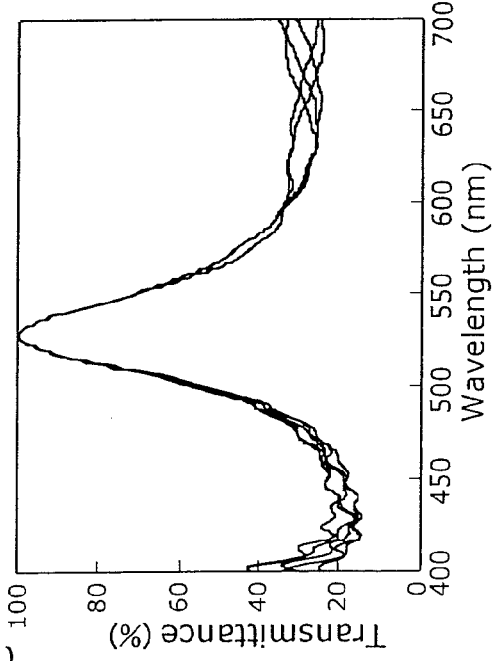

Note that FIGS. 16B through 16D show the color separation characteristic in the solid-state imaging device 1402 according to the present embodiment for the unit pixel 1001*a* for B light, the unit pixel 1001*b* for R light and the unit pixel 1001*c* for G light, when the film thickness of each silicon dioxide 1030 (500 nm) planarizing layer is changed by −200 nm, −100 nm, 0 nm, +100 nm and +200 nm respectively.

When FIGS. 14B through 14D according to the fifth embodiment above are compared with FIGS. 16B through 16D, it is clear that the affect on the color separation characteristic by variation in the film thickness of the silicon dioxide 1030 can be reduced by using the solid-state imaging device 1402 according to the present embodiment.

Seventh Embodiment

Figure 17:
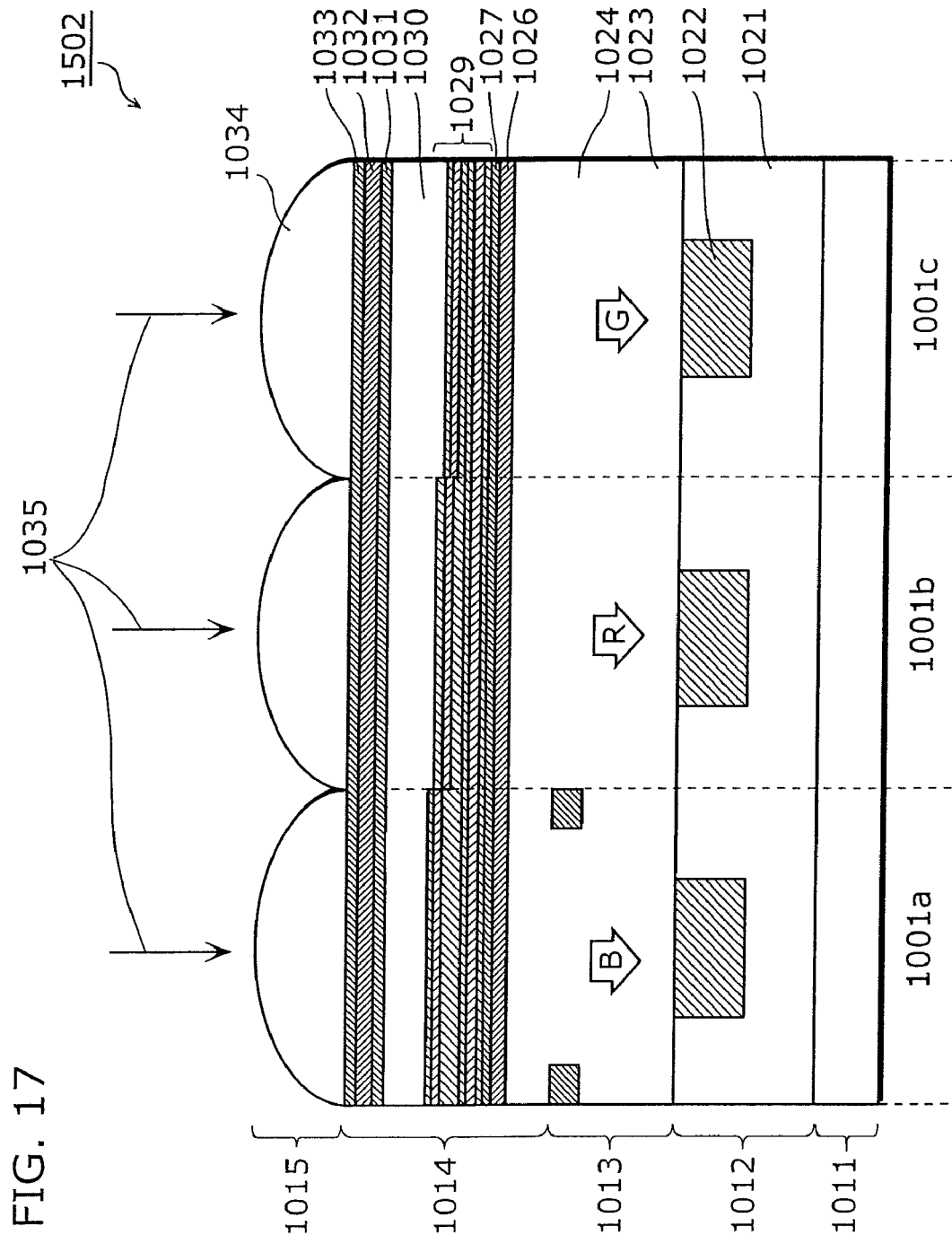
FIG. 17 is a base cross-section diagram which shows the structure of the unit pixels according to the seventh embodiment.

FIG. 17 is a substrate cross-section diagram which shows the structure of the unit pixels (1001*a*, 1001*b* and 1001*c*) in a solid-state imaging device 1502 according to the present embodiment. The unit pixels 1001*a* through 1001*c* according to the present embodiment differ from the sixth embodiment above in that the silicon oxide nitride layer 1025 is removed as an antireflection film from the first barrier film 1026. The other structural elements are the same as in the sixth embodiment, and thus their explanation is not repeated.

Figure 18B:
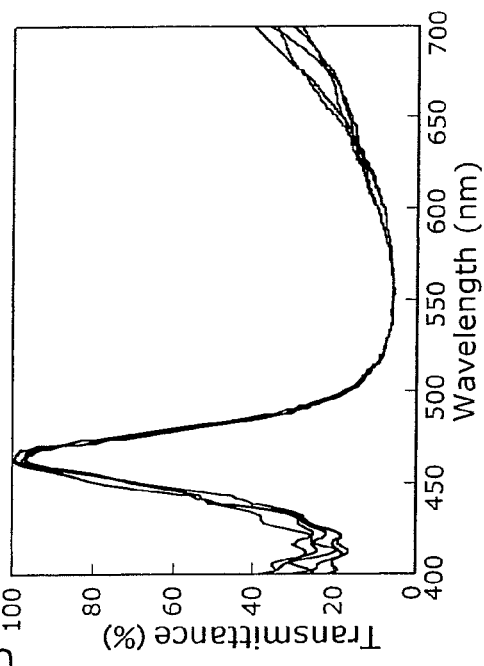
FIGS. 18A through 18D is a diagram which shows the color separation characteristic in the unit pixel according to the seventh embodiment.
Figure 18D:
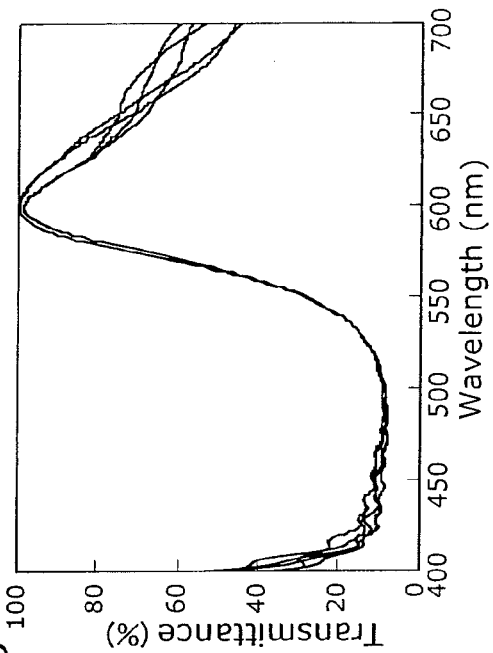
Figure 18A:
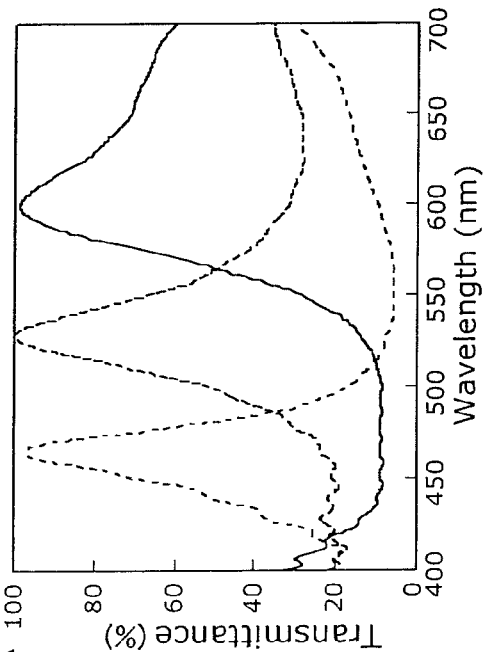
Figure 18C:
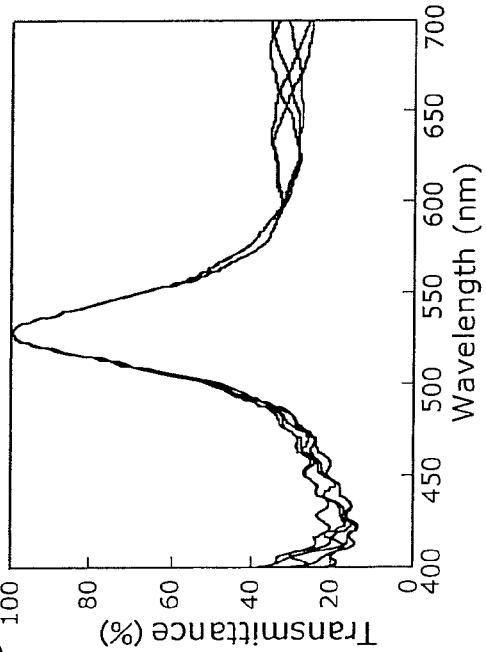

FIG. 18A is a diagram which shows the color separation characteristic for each unit pixel (1001*a*, 1001*b*, 1001*c*) in the solid-state imaging device 1502 according to the present embodiment. By utilizing the structure shown in the above FIG. 17, the transmission bandwidth can be expanded compared to FIG. 16A which shows the color separation characteristic in the sixth embodiment. Note that FIGS. 18B through 18D show the color separation characteristic in the solid-state imaging device 1502 according to the present embodiment for the unit pixel 1001*a* for B light, the unit pixel 1001*b* for R light and the unit pixel 1001*c* for G light, when the film thickness of each silicon dioxide 1030 (500 nm) planarizing layer is changed by −200 nm, −100 nm, 0 nm, +100 nm and +200 nm respectively.

Antireflection layers 1031 and 1033 are formed on the second barrier film 1032 in the solid-state imaging device 1502 shown in FIG. 17, and since the antireflection layer 1027 and the first barrier film 1026 are adjacent to the color filter 1029, there is no need for planarization, and it is possible to eliminate the affects of film thickness variation in the planarizing layer on the color separation characteristic.

Accordingly, a highly sensitivity and excellent color separation characteristic can be realized by utilizing the solid-state imaging device 1502 in the present embodiment.

Figure 19B:
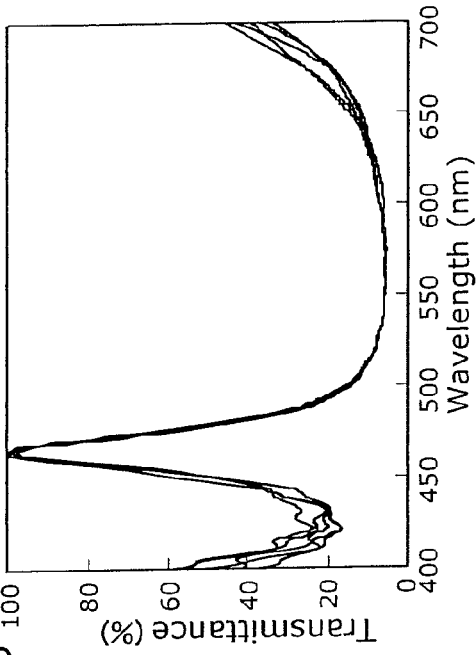
FIGS. 19A through 19D is a diagram which shows the color separation characteristic modification in the unit pixel according to the seventh embodiment.
Figure 19D:
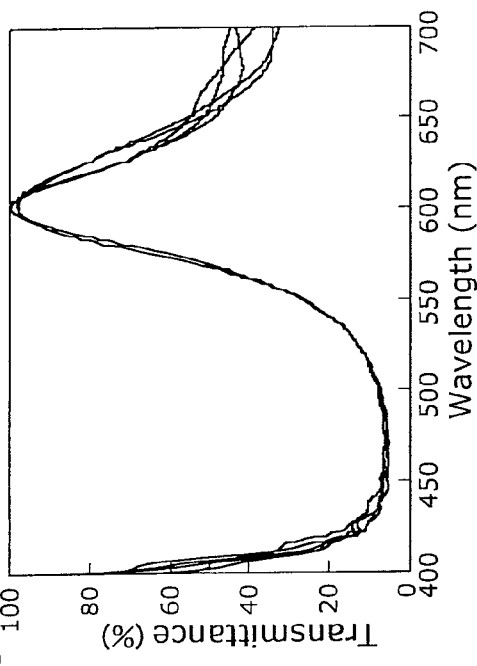
Figure 19A:
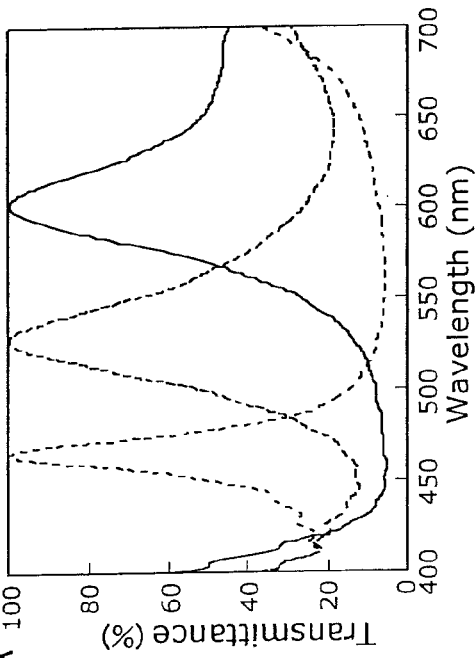
Figure 19C:
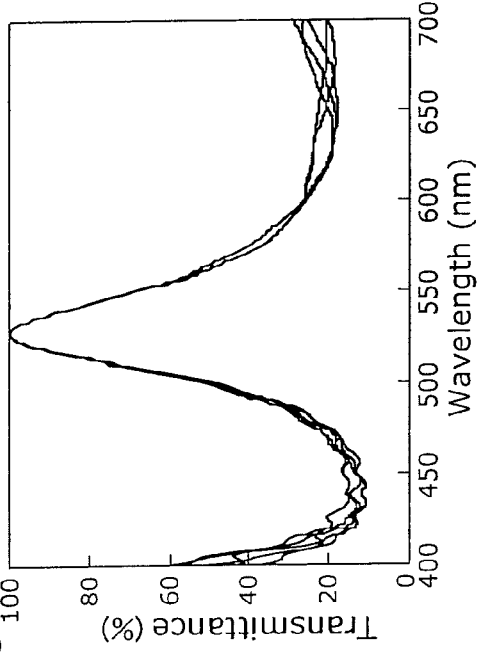

Additionally, the color separation characteristic of each unit pixel (1001*a*, 1001*b* and 1001*c*) in the solid-state imaging device is shown in FIG. 19A, where the antireflection film 1027 has been removed in FIG. 15 in the sixth embodiment above (in other words, when the structure is configured of only the antireflection film 1025), as a modification of the solid-state imaging device 1502 shown in FIG. 17. Note that FIGS. 19B through 19D show the color separation characteristic of the unit pixel 1001a for B light, the unit pixel 1001b for R light and the unit pixel 1001c for G light when the film thickness of each silicon dioxide film 1030 (500 nm) planarizing layer is changed by −200 nm, −100 nm, 0 nm, +100 nm and +200 nm respectively.

Figure 20A:
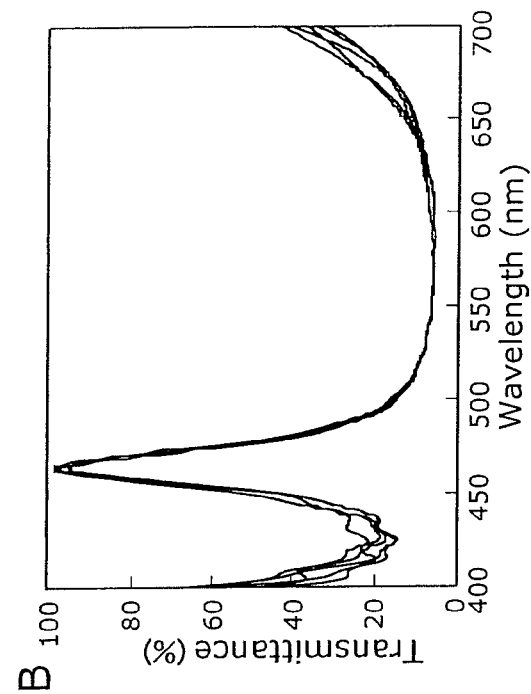
FIGS. 20A through 20D is a diagram which shows another modification of the color separation characteristic in the unit pixel according to the seventh embodiment.
Figure 20B:
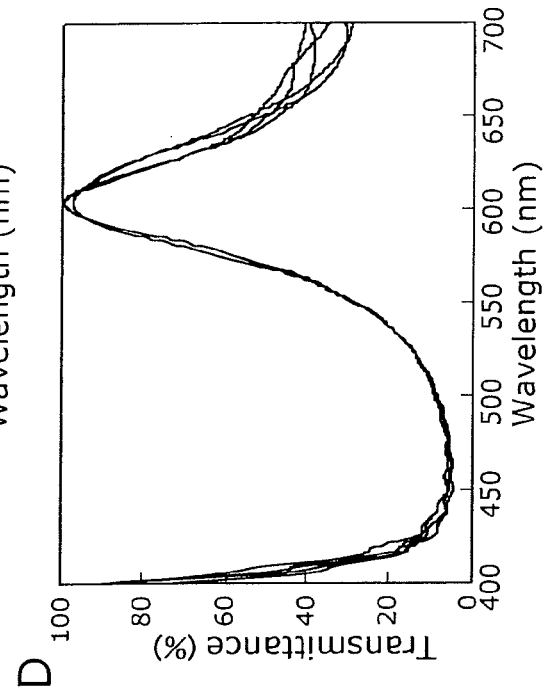
Figure 20C:
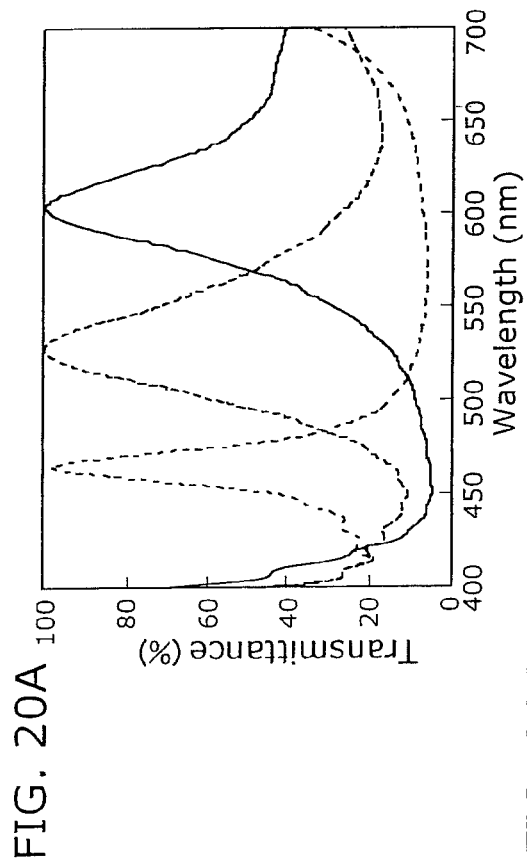
Figure 20D:
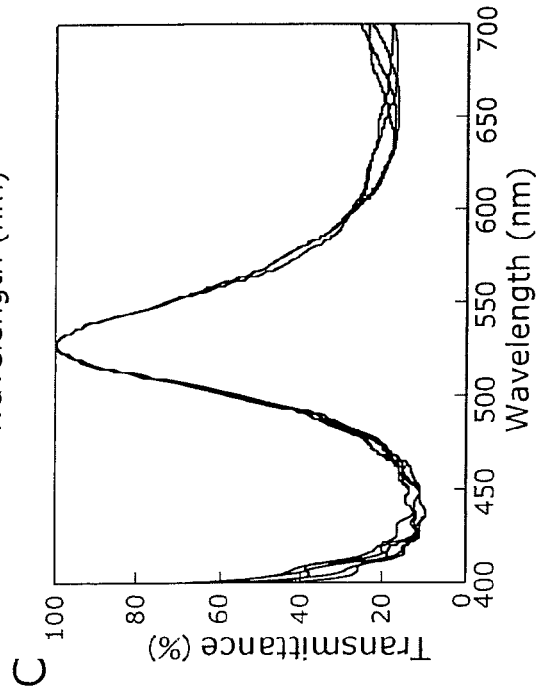

In the same way, the color separation characteristic of each unit pixel (1001a, 1001b, 1001c) in the solid-state imaging device in which the antireflection films 1025 and 1027 have been removed in FIG. 15 in the sixth embodiment above (in other words, when the structure is configured of only the first barrier film 1026) is shown in FIG. 20A, as a modification of the solid-state imaging device 1502 shown in FIG. 17. Note that FIGS. 20B through 20D show the color separation characteristic for the unit pixel 1001a for B light, the unit pixel 1001b for R light and the unit pixel 1001c for G light, when the film thickness of each silicon dioxide film 1030 (500 nm) planarizing layer is changed by −200 nm, −100 nm, 0 nm, +100 nm and +200 nm respectively.

In both of the modification structures above, the transmittance band narrows, and it is clear that variation in the film thickness of the silicon dioxide 1030 has almost no affect on the color separation characteristic.

Therefore, a structure with the color separation properties in FIG. 16 and FIG. 18 is utilized in order to high sensitivity, and it is clear that the structure having the color separation characteristic in FIG. 19 and FIG. 20 may be utilized.

Following from the above, it is clear that the affect on the color separation property by variation in the film thickness for the silicon dioxide 1030 is reduced.

Eighth Embodiment

Figure 21:
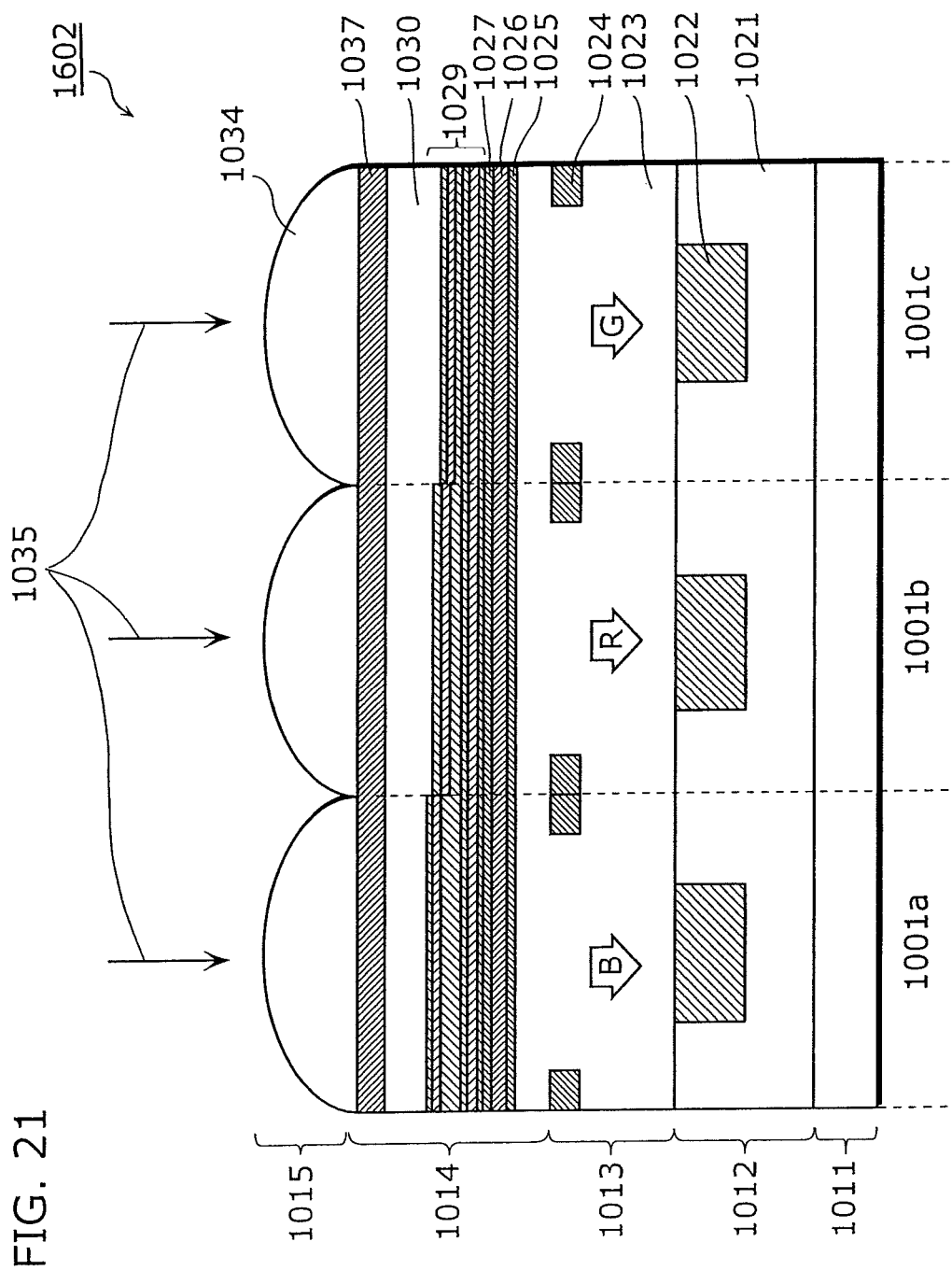
FIG. 21 is a base cross-section diagram which shows the structure of the unit pixels according to the eighth embodiment.

FIG. 21 is a substrate cross-section diagram which shows the structure of the base pixels (1001a, 1001b and 1001c) in the solid-state imaging device 1602 according to the present embodiment. The unit pixels 1001a through 1001c according to the present embodiment differ from the sixth embodiment in that the barrier films are composed of only the silicon oxide nitride film 1037. The other structural elements are the same as in the sixth embodiment, and thus their explanation is not repeated.

Thus, the film thickness of the silicon oxide nitride film 1037 is 170 nm which is a λ/2 film for 530 nm which is the set wavelength of the color filter 1029.

Figure 22B:
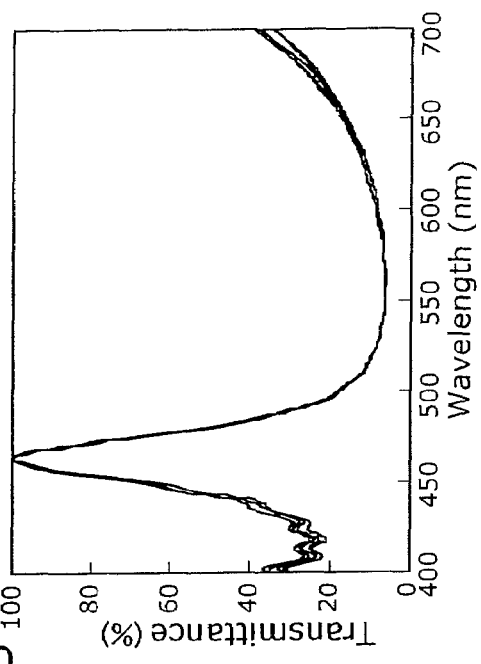
FIGS. 22A through 22D is a diagram which shows the color separation characteristic in the unit pixel according to the eighth embodiment.
Figure 22D:
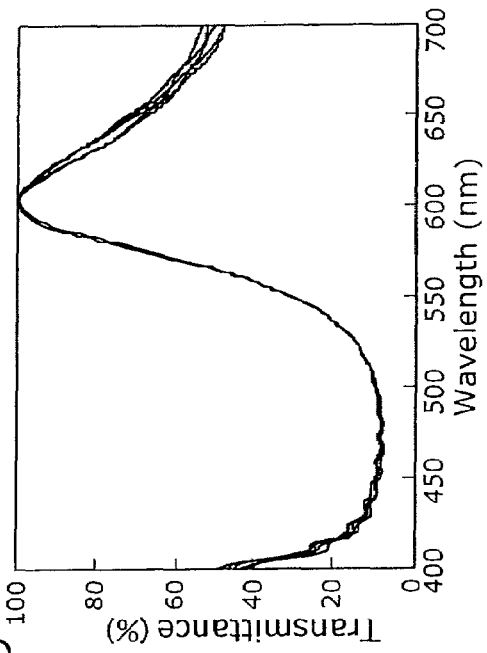
Figure 22A:
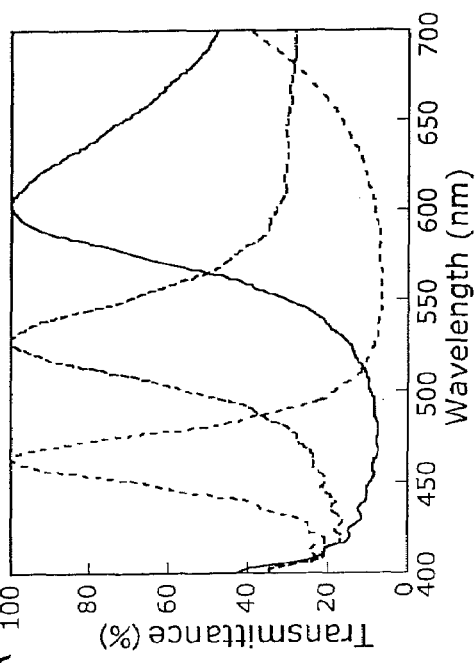
Figure 22C:
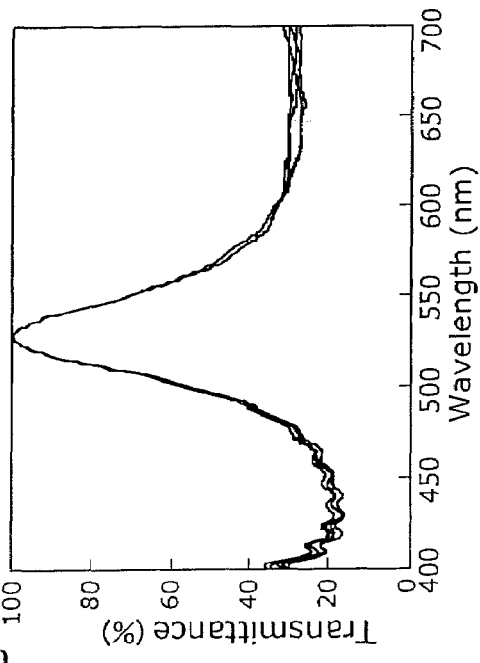

FIG. 22A is a diagram which shows the color separation characteristic for each unit pixel (1001a, 1001b, 1001c) in the solid-state imaging device 1602 according to the present embodiment. Additionally, FIGS. 22B through 22D show the color separation characteristic of the solid-state imaging device 1602 in the present embodiment for the unit pixel 1001a for B light, the unit pixel 1001b for R light and the unit pixel 1001c for G light when the film thickness of each silicon dioxide film 1030 (500 nm) planarizing layer is changed by −200 nm, −100 nm, 0 nm, +100 nm and +200 nm respectively.

By utilizing the structure in FIG. 21, since the difference in the refractive index of the silicon dioxide 1030 (n=1.46) and the silicon dioxide nitride film 1037 (n=1.56) is "0.10", and is smaller than the difference in the refractive index "0.54" between the silicon dioxide 1030 (n=1.46) and the tri-silicon tetra-nitride film (n=2.0) which is a barrier film, and thus reflectance decreases. Accordingly, the affect on the color separation characteristic caused by variation in the film thickness of the silicon dioxide 1030 is reduced.

Accordingly, by utilizing the structure in the present embodiment, a solid-state imaging device with an excellent color separation characteristic can be realized with high sensitivity.

Note that although not shown in FIG. 21, in the same way as the antireflection film indicated by the seventh embodiment, the antireflection film 1025 and 1027 made of silicon oxide nitride film may or may not be present.

Additionally, the color filter 1029 in the third through eighth embodiments above indicate a structural example in which one spacer layer is inserted, however the effect of the present invention can be performed even if, instead, the color filter 1029 is structured with two or three spacer layers as shown in the first or the second embodiment above.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The solid-state imaging device according to the present invention can be utilized in a digital still camera, a digital video camera, a cellular phone and so on, and is useful as technology for widening the bandwidth of light that passes through the color filter included in the solid-state imaging device and more reliably reproducing color.

What is claimed is:

1. A solid-state imaging device in which unit pixels are arranged in a two-dimensional shape, each of the unit pixels including a color filter, through which light of a predetermined color in incident light passes, the color filter including, when a set wavelength is λ:
    a plurality of three layer films, each of the three layer films including a dielectric layer disposed between first layers; and
    a second layer disposed between each of the three layer films,
    wherein the dielectric layer controls the light which passes through the color filter and has an optical film thickness different than λ/4,
    each of the first layers is a high refractive index material having an optical film thickness of λ/4, and
    the second layer is a low refractive index material having an optical film thickness of λ/4.

2. The solid-state imaging device according to claim 1, wherein each dielectric layer in the plurality of three layer films has a same optical film thickness.

3. The solid-state imaging device according to claim 2, wherein a first unit pixel and a second unit pixel allow different colors to pass, and
    an optical film thickness of said dielectric layer in said first unit pixel differs from an optical film thickness of said dielectric layer in said second unit pixel.

4. The solid-state imaging device according to claim 1, wherein the plurality of three layer films includes a first three layer film, a second three layer film and a third three layer film.

5. The solid-state imaging device according to claim 4, wherein an optical film thickness of the dielectric layer of the first three layer film or an optical film thickness of the dielectric layer of the second three layer film differs from an optical film thickness of the dielectric layer of the third three layer film.

6. The solid-state imaging device according to claim 1, wherein the color filter has a vertically symmetrical structure.

7. The solid-state imaging device according to claim 1, wherein the unit pixels include a first unit pixel, a second unit pixel and a third unit pixel,
the dielectric layer of each of the three layer films of the color filter of the first unit pixel have an optical film thickness in a range of 0 to $\lambda/4$,
the dielectric layer of each of the three layer films of the color filter of the second unit pixel have an optical film thickness that is in a range of $\lambda/4$ to $\lambda/2$, and
the dielectric layer of each of the three layer films of the color filter of the third unit pixel have an optical film thickness that is approximately equal to $\lambda/2$.

8. The solid-state imaging device according to claim 1, wherein the dielectric layer comprises a same material as one of the first layer and the second layer.

9. The solid-state imaging device according to claim 1, wherein the high refractive index material is one of titanium dioxide, nitride silicon, ditantalum pentaoxide, niobium pentaoxide and zirconium dioxide, and the low refractive index material is silicon dioxide.

10. The solid-state imaging device according to claim 1, further comprising:
a barrier film having an optical film thickness approximately equal to $\lambda/2$.

11. The solid-state imaging device according to claim 10, wherein said barrier film is adjacent to the color filter.

12. The solid-state imaging device according to claim 10, wherein an antireflection film having an optical film thickness approximately equal to $\lambda/4$ is formed on at least one of a top surface and a bottom surface of said barrier film.

13. The solid-state imaging device according to claim 10, wherein an antireflection film having an optical film thickness approximately equal to $\lambda/4$ is formed on a side of said barrier film where the color filter is.

14. The solid-state imaging device according to claim 10, wherein said barrier film includes:
a first barrier film on an incident light side of the color filter, and
a second barrier film on a projected light side of the color filter,
respective film thicknesses of said first barrier film and said second barrier film being equal.

15. The solid-state imaging device according to claim 10, wherein said barrier film is a tn-silicon tetra-nitride film.

16. The solid-state imaging device according to claim 12, wherein said antireflection film is a silicon oxide nitride film.

17. The solid-state imaging device according to claim 10, wherein said barrier film is a silicon oxide nitride film.

18. A camera which includes a solid-state imaging device in which unit pixels are arranged in a two-dimensional shape, each of the unit pixels including a color filter, through which light of a predetermined color in incident light passes, the color filter including, when a set wavelength is $\lambda$:
a plurality of three layer films, each of the three layer films including a dielectric layer disposed between first layers; and
a second layer disposed between each of the three layer films,
wherein the dielectric layer controls the light which passes through the color filter and has an optical film thickness different than $\lambda/4$,
each of the first layers is a high refractive index material having an optical film thickness of $\lambda/4$, and
the second layer is a low refractive index material having an optical film thickness of $\lambda/4$.

* * * * *